(12) United States Patent
Wang et al.

(10) Patent No.: US 11,727,976 B2
(45) Date of Patent: Aug. 15, 2023

(54) SEMICONDUCTOR DEVICES INCLUDING FERROELECTRIC MEMORY AND METHODS OF FORMING THE SAME

(71) Applicant: Taiwan Semiconductor Manufacturing Co., Ltd., Hsinchu (TW)

(72) Inventors: Chenchen Wang, Hsinchu (TW); Sai-Hooi Yeong, Zhubei (TW); Chi On Chui, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/814,755

(22) Filed: Jul. 25, 2022

(65) Prior Publication Data

US 2022/0358983 A1 Nov. 10, 2022

Related U.S. Application Data

(62) Division of application No. 17/099,094, filed on Nov. 16, 2020, now Pat. No. 11,501,812.

(Continued)

(51) Int. Cl.
*H01L 29/78* (2006.01)
*H01L 29/51* (2006.01)
*G11C 11/22* (2006.01)

(52) U.S. Cl.
CPC .......... *G11C 11/221* (2013.01); *H01L 29/516* (2013.01); *H01L 29/78391* (2014.09)

(58) Field of Classification Search
CPC ............ H01L 29/516; H01L 29/78391; H01L 29/785; H01L 29/0673; H01L 29/775;
(Continued)

(56) References Cited

U.S. PATENT DOCUMENTS 6,048,740 A * 4/2000 Hsu .................. H01L 29/78391
257/295
6,737,689 B1 * 5/2004 Schlosser .............. H01L 29/516
438/785

(Continued)

FOREIGN PATENT DOCUMENTS

KR 1020020072846 A 9/2002
KR 1020060038245 A 5/2006
(Continued)

*Primary Examiner* — Sheikh Maruf
(74) *Attorney, Agent, or Firm* — Slater Matsil, LLP

(57) ABSTRACT

A semiconductor device including a capacitor, with a memory film isolating a first electrode from a contact, formed over a transistor and methods of forming the same are disclosed. In an embodiment, a semiconductor device includes a gate stack over a semiconductor substrate; a capacitor over the gate stack, the capacitor including a first electrode extending along a top surface of the gate stack, the first electrode being U-shaped; a first ferroelectric layer over the first electrode; and a second electrode over the first ferroelectric layer, a top surface of the second electrode being level with a top surface of the first ferroelectric layer, and the top surface of the first ferroelectric layer and the top surface of the second electrode being disposed further from the semiconductor substrate than a topmost surface of the first electrode.

20 Claims, 37 Drawing Sheets

Related U.S. Application Data

(60) Provisional application No. 63/059,214, filed on Jul. 31, 2020.

(58) Field of Classification Search
CPC ........... H01L 27/1159; H01L 29/40111; H01L 27/11507; H01L 28/92
USPC .............................................. 438/3; 257/295
See application file for complete search history.

(56) References Cited

U.S. PATENT DOCUMENTS

| | | | |
|---|---|---|---|
| 8,530,356 B2 | 9/2013 | Gouk et al. | |
| 10,403,631 B1* | 9/2019 | Lu | H01L 21/76829 |
| 10,468,427 B2 | 11/2019 | Cai et al. | |
| 11,114,564 B2 | 9/2021 | Chen et al. | |
| 2002/0076495 A1* | 6/2002 | Maloney | H01L 21/02205 |
| | | | 427/256 |
| 2002/0149977 A1 | 10/2002 | Oh | |
| 2003/0228712 A1* | 12/2003 | Liu | H10B 51/00 |
| | | | 257/E21.663 |
| 2004/0164293 A1* | 8/2004 | Maloney | H01L 21/76813 |
| | | | 257/E21.235 |
| 2006/0094216 A1 | 5/2006 | Nam | |
| 2006/0141736 A1 | 6/2006 | Kong et al. | |
| 2010/0233864 A1* | 9/2010 | Lee | H01L 29/6659 |
| | | | 257/E21.409 |
| 2013/0093048 A1* | 4/2013 | Chang | H01L 21/30612 |
| | | | 257/532 |
| 2014/0106523 A1* | 4/2014 | Koldiaev | H01L 29/78696 |
| | | | 438/212 |
| 2018/0226417 A1* | 8/2018 | Ando | H01L 27/092 |
| 2019/0130956 A1* | 5/2019 | Müller | H01L 29/0673 |
| 2020/0006352 A1 | 1/2020 | Avcil et al. | |

FOREIGN PATENT DOCUMENTS

| | | |
|---|---|---|
| KR | 1020060074972 A | 7/2006 |
| TW | 201933641 A | 8/2019 |
| TW | 202010111 A | 3/2020 |

* cited by examiner

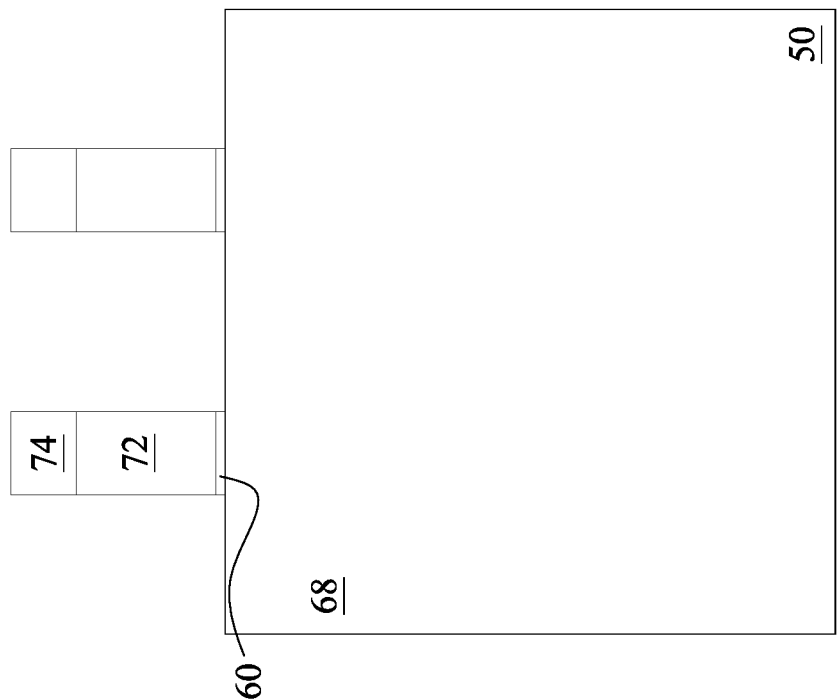
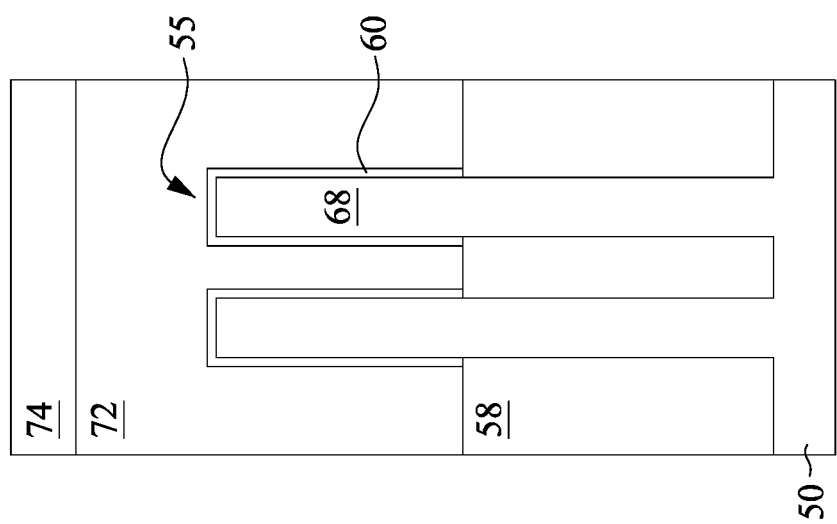
Fig. 6A
Fig. 6B

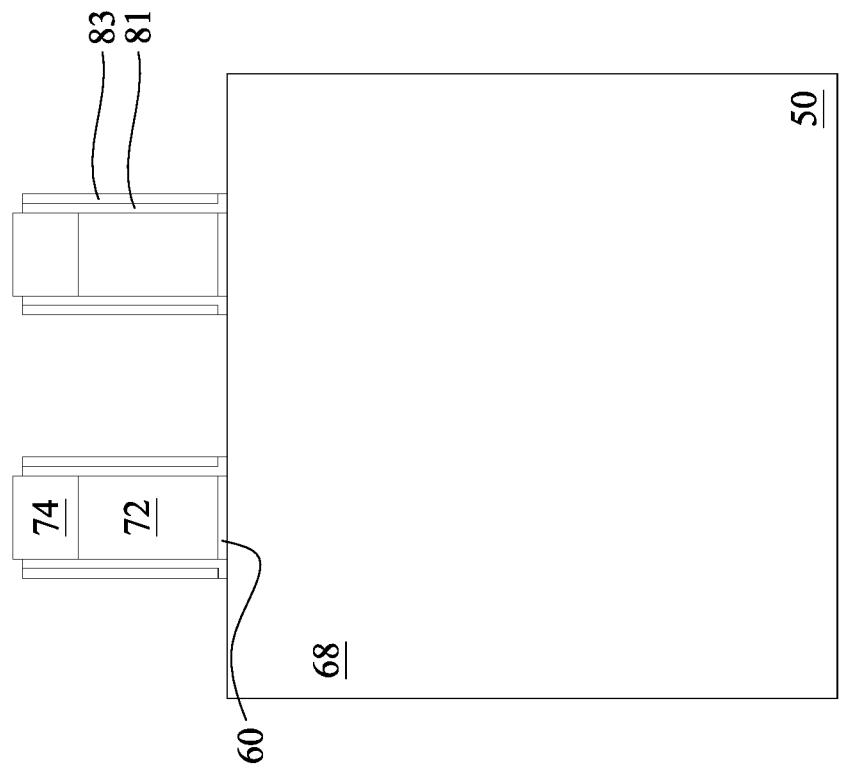
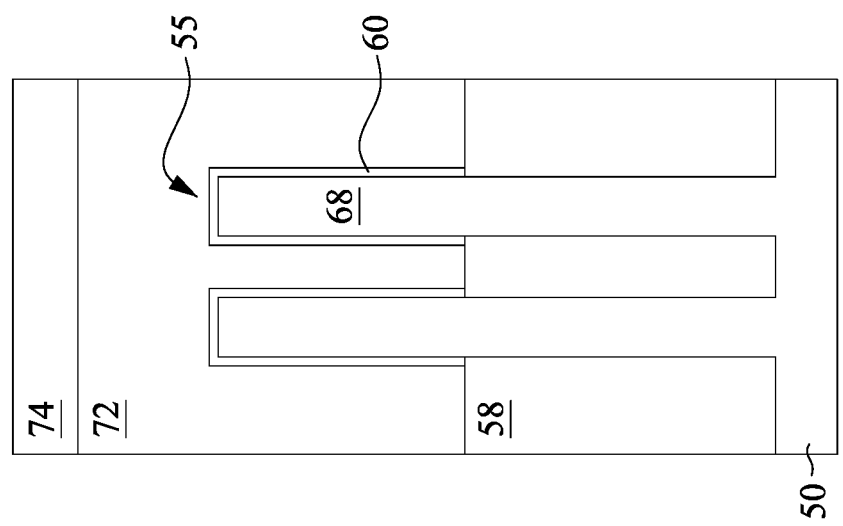
Fig. 8A
Fig. 8B

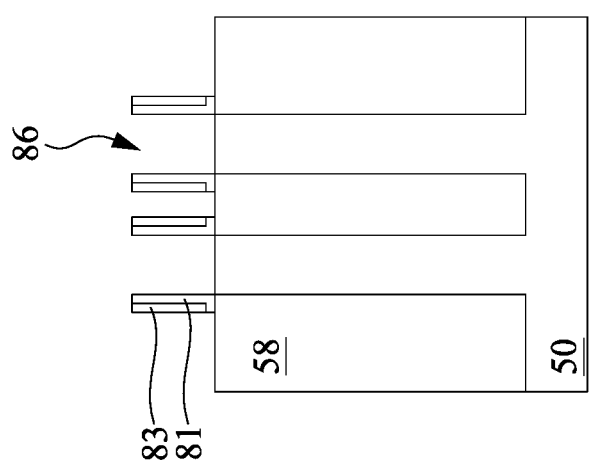

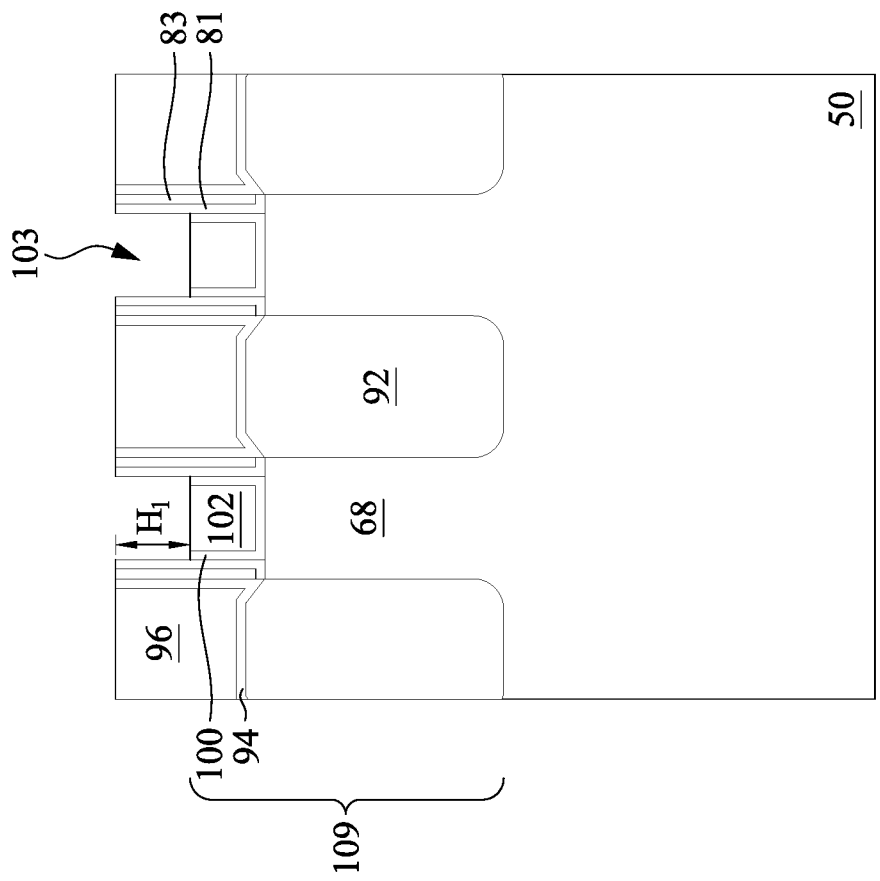
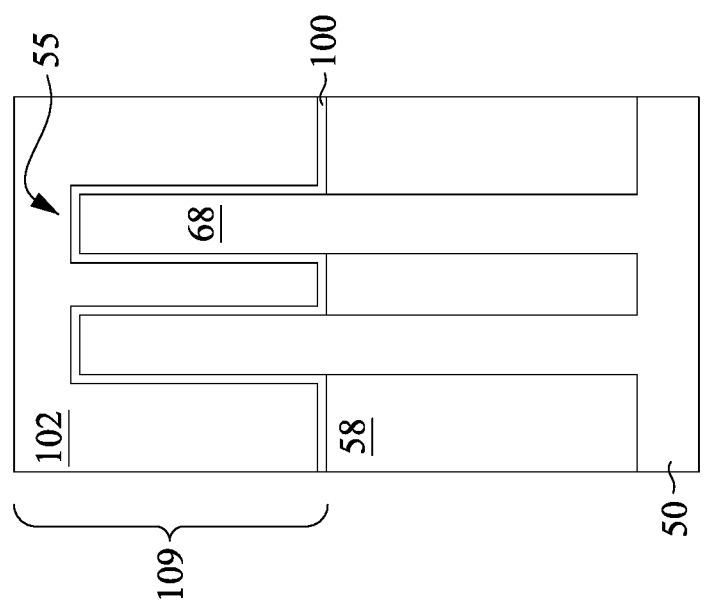
Fig. 15B
Fig. 15A

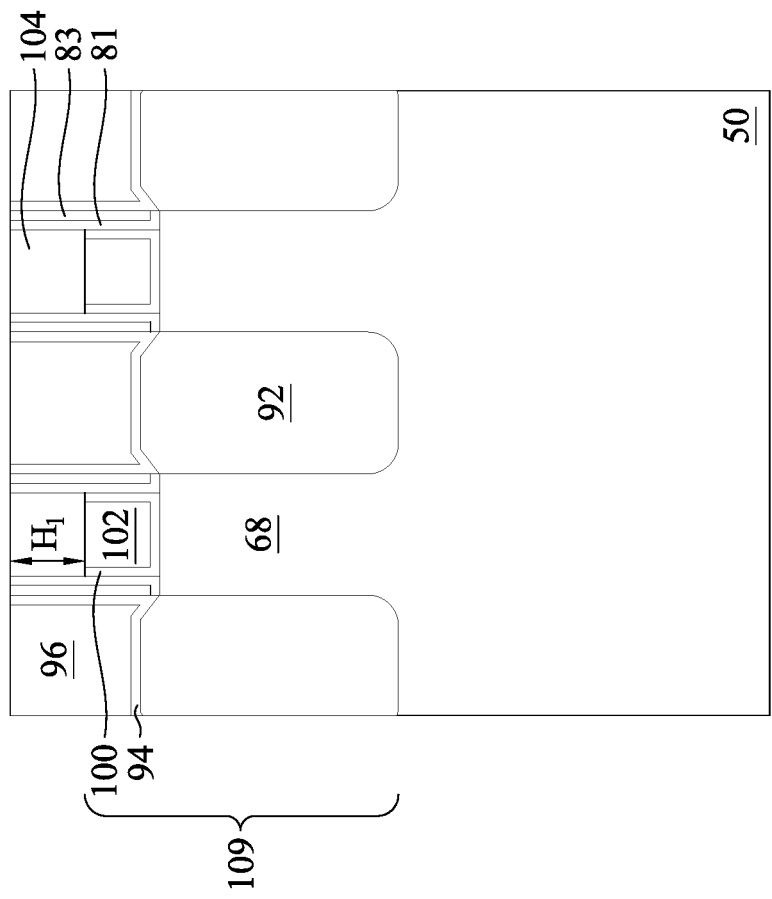
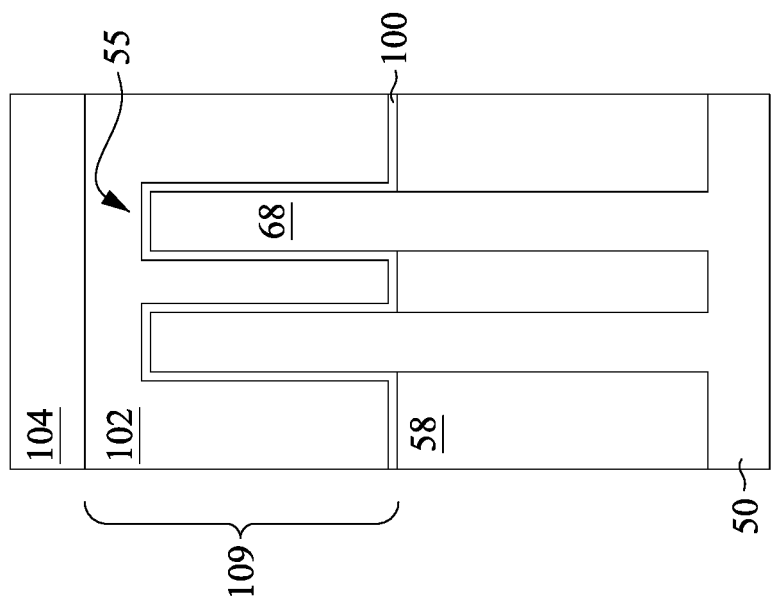
Fig. 16B
Fig. 16A

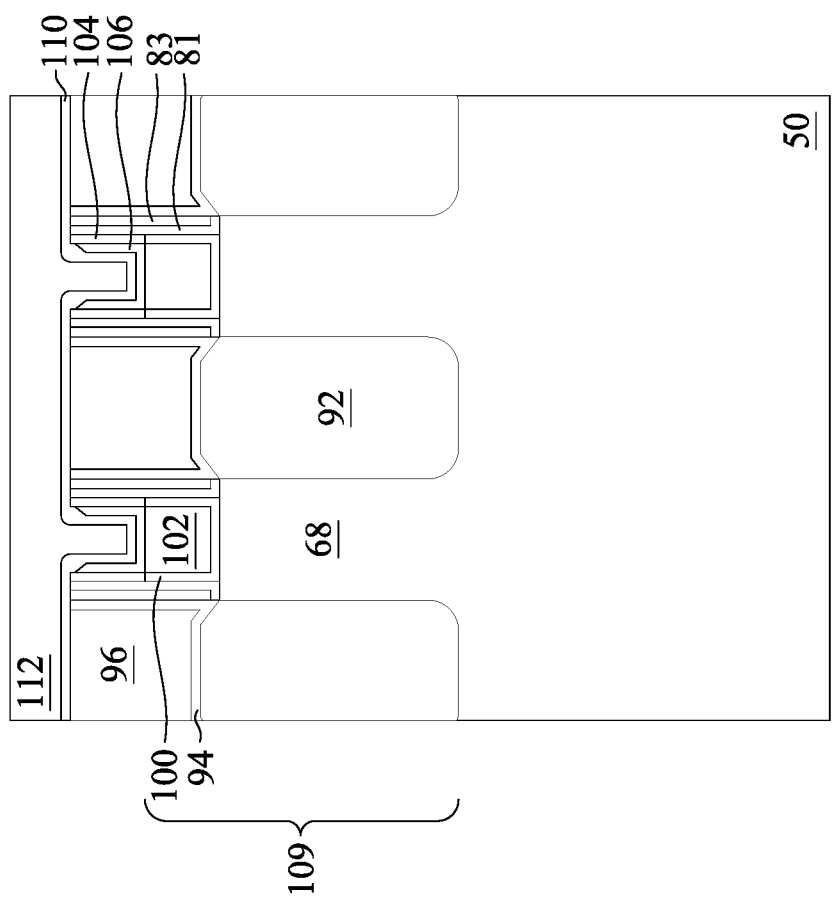
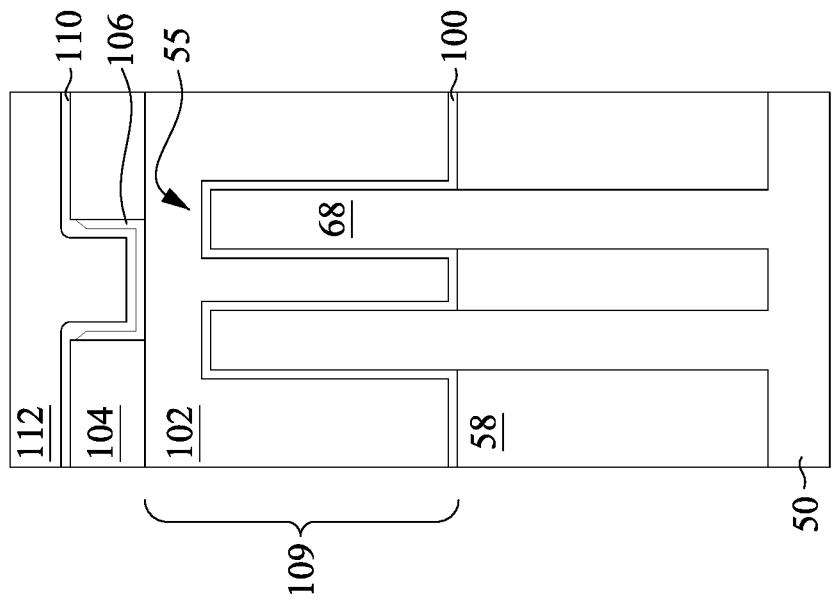
Fig. 20B
Fig. 20A

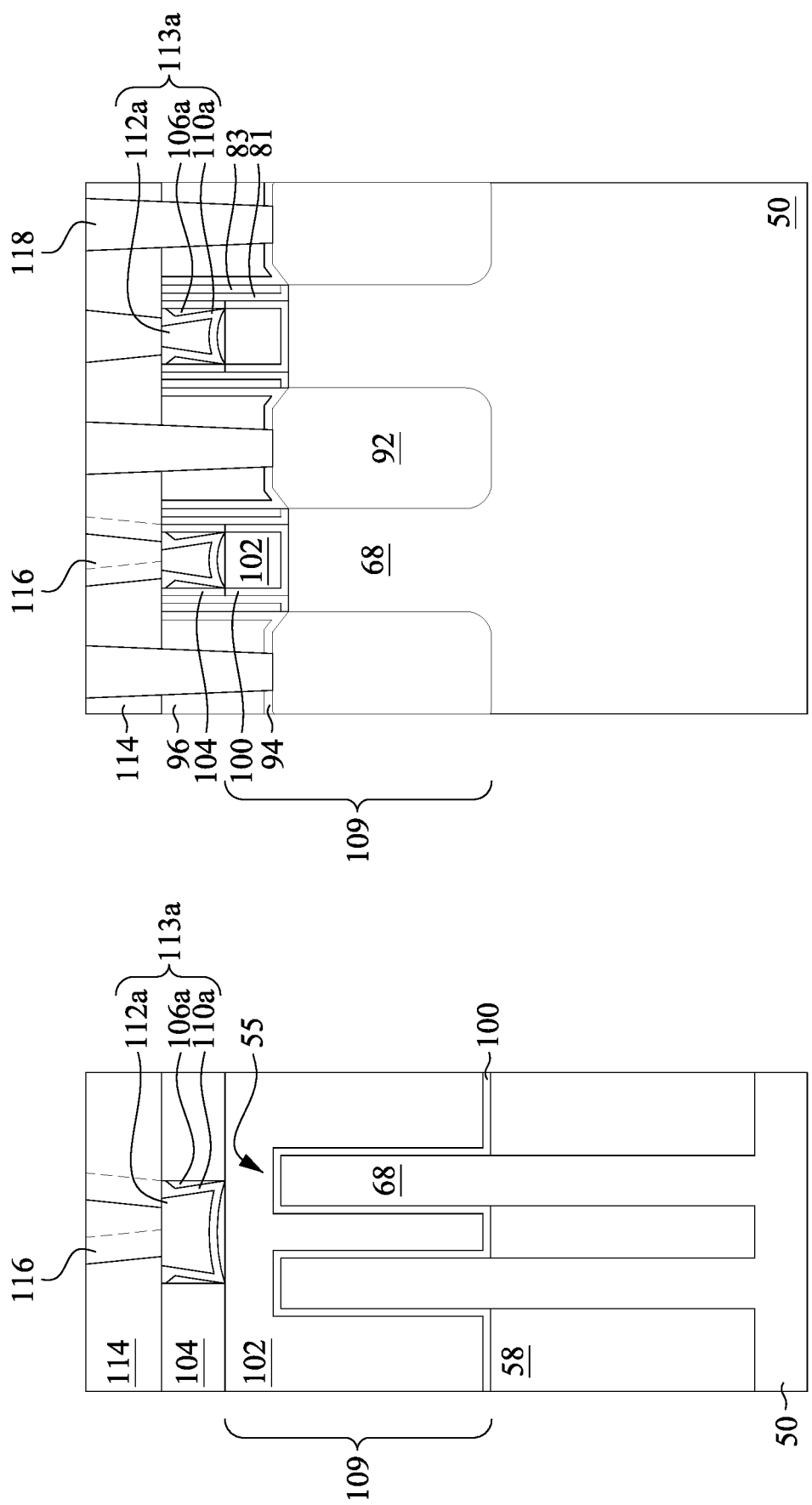

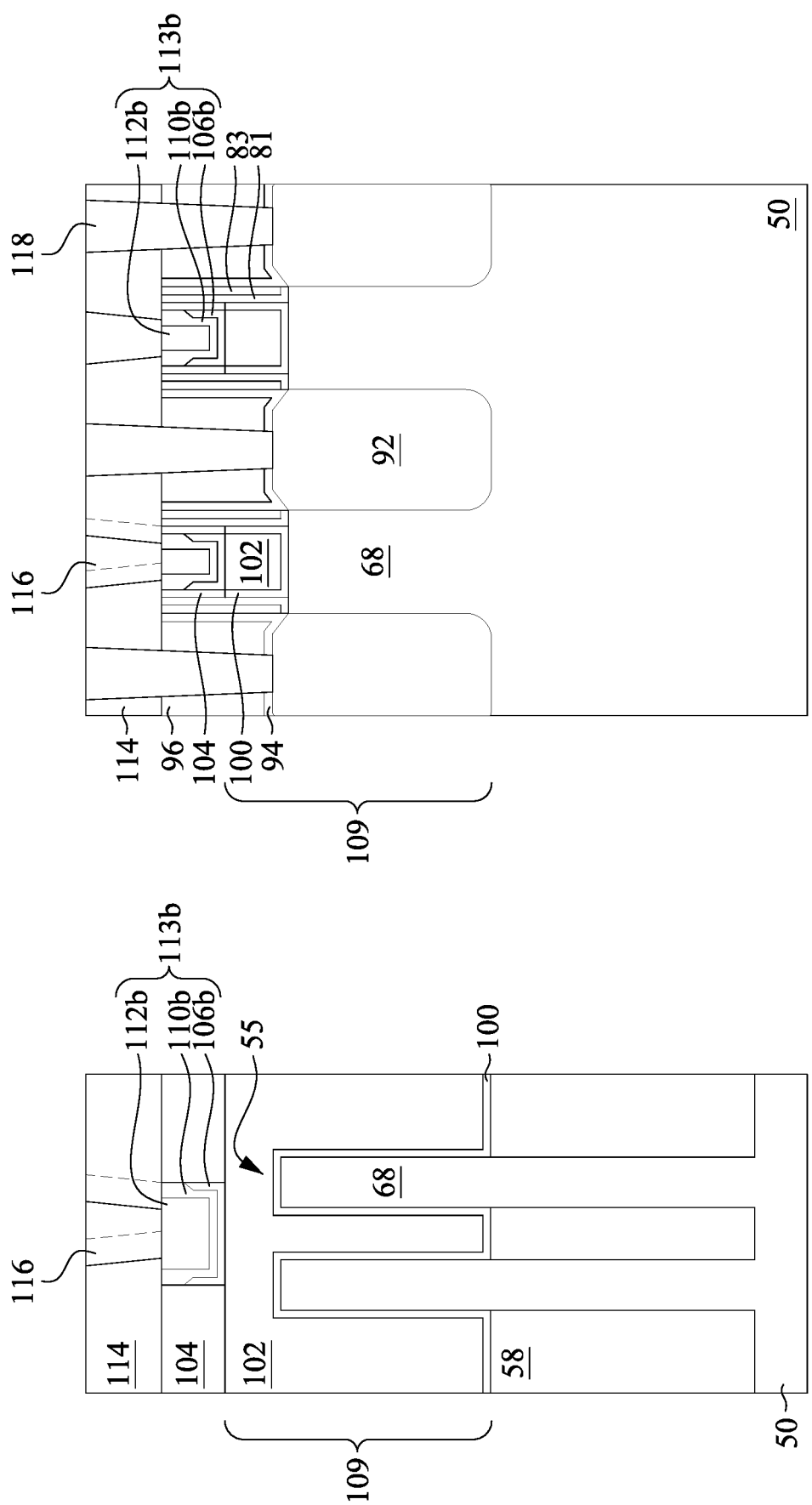

SEMICONDUCTOR DEVICES INCLUDING FERROELECTRIC MEMORY AND METHODS OF FORMING THE SAME

PRIORITY CLAIM AND CROSS-REFERENCE

This application is a divisional of U.S. patent application Ser. No. 17/099,094, filed on Nov. 16, 2020, and entitled "Semiconductor Devices Including Ferroelectric Memory and Methods of Forming the Same," which claims the benefit of U.S. Provisional Patent Application No. 63/059,214, filed on Jul. 31, 2020, and entitled "Optimized Metal-Ferroelectric-Metal Design for SAC Integrated FERAM Memory," which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FERAM, or FRAM). Advantages of FERAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 7C, 8A, 8B, 8C, 9A, 9B, 9C, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 31A, 31B, 32A, and 32B are cross-sectional views of intermediate stages in the manufacturing of FinFETs, in accordance with some embodiments.

DETAILED DESCRIPTION

Figure 1:
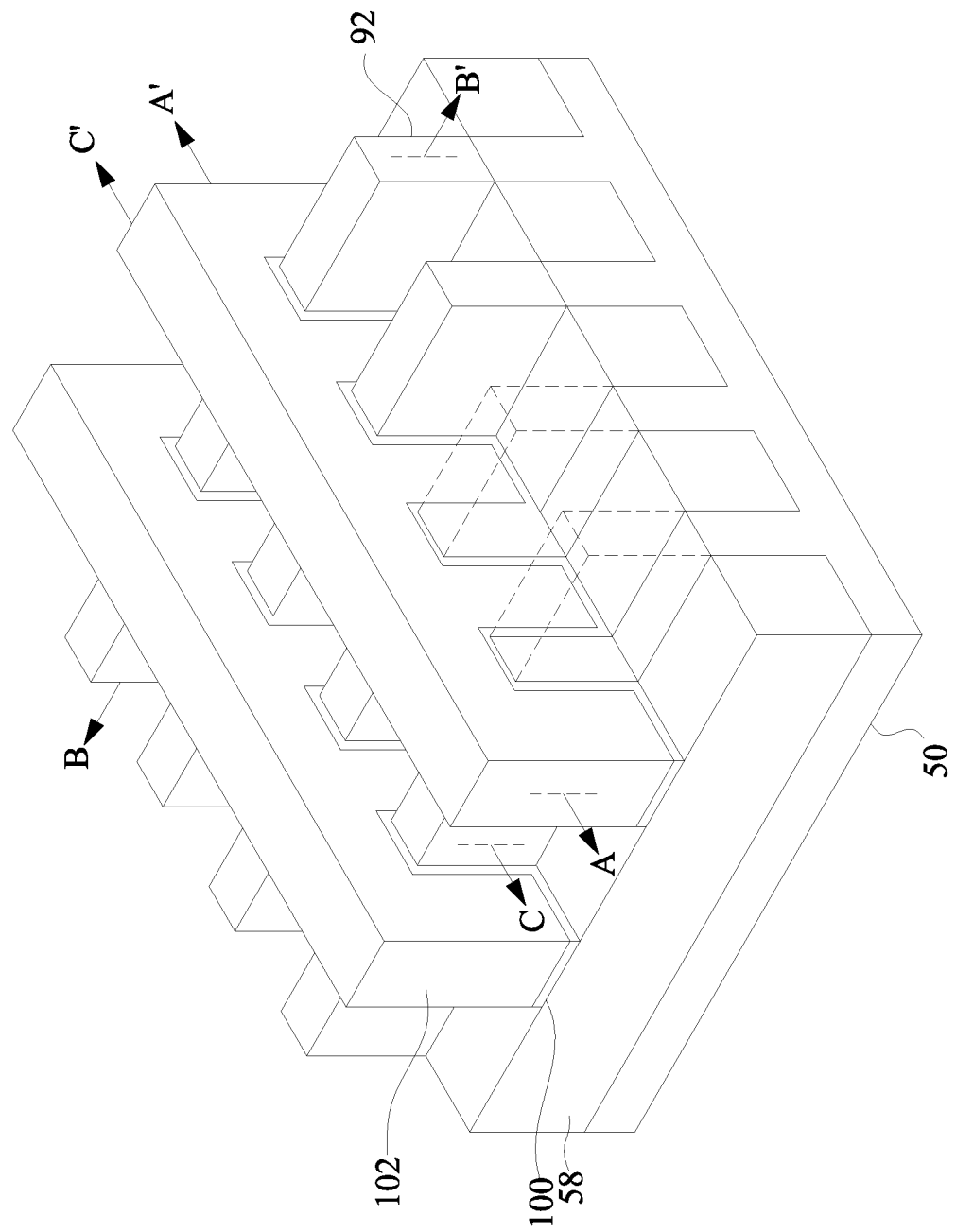
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a one transistor one capacitor (1T-1C) memory cell including a capacitor formed over a gate of a transistor and methods of forming the same. In some embodiments, the capacitor may include a ferroelectric (FE) material and the memory cell may be a ferroelectric random access memory (FERAM) cell. The capacitor may be formed by forming a trench over the gate, forming spacers in the trench, depositing a bottom electrode layer in the trench, patterning the bottom electrode layer such that top surfaces of the bottom electrode layer are below top surfaces of the spacers, depositing memory film (e.g., a ferroelectric material) over the bottom electrode layer, and depositing a top electrode layer over the memory film. A contact is then formed extending to the top electrode layer with the memory film being interposed between the bottom electrode layer and the contact. Patterning the bottom electrode layer before depositing the memory film and the top electrode layer over the bottom electrode layer isolates the bottom electrode from the contact, preventing shunting between the contact and the bottom electrode layer. This reduces errors and improves device performance.

FIG. 1 illustrates a three-dimensional view of an example of fin field-effect transistors (FinFETs), in accordance with some embodiments. The FinFETs comprise fins 55 on a substrate 50 (e.g., a semiconductor substrate). Shallow trench isolation (STI) regions 58 are disposed in the substrate 50, and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portion extending between the neighboring STI regions 58.

Gate dielectric layers 100 are along sidewalls and over top surfaces of the fins 55 and gate electrodes 102 are over the gate dielectric layers 100. Epitaxial source/drain regions 92 are disposed in opposite sides of the fins 55 with respect to the gate dielectric layers 100 and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the source/drain regions 92 of the FinFETs. Cross-section B-B' is perpendicular to cross-section A-A' and is along a longitudinal axis of a fin 55 and in a direction of, for example, a current flow between the epitaxial source/drain regions 92 of the FinFETs. Cross-section C-C' is parallel to cross-section A-A' and extends through the source/drain regions 92 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field-effect transistors (NSFETs), or the like.

FIGS. 2 through 32B are cross-sectional views of intermediate stages in the manufacturing of memory devices, in accordance with some embodiments. FIGS. 2 through 5 are illustrated along reference cross-section A-A' illustrated in FIG. 1 in an n-type region 50N and a p-type region 50P. FIGS. 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, and 32A are illustrated along reference cross-section A-A' illustrated in FIG. 1 in either of the n-type region 50N or the p-type region 50P. FIGS. 6B, 7B, 8B, 9B, 10B, 11B, 12B, 13B, 14B, 14C, 15B, 16B, 17B, 18B, 19B, 20B, 21B, 22B, 23B, 24B, 25B, 26B, 27B, 28B, 29B, 30B, 31B, and 32B are illustrated along reference cross-section B-B' illustrated in FIG. 1. FIGS. 7C, 8C, 9C, 10C, and 10D are illustrated along reference cross-section C-C' illustrated in FIG. 1.

Figure 2:
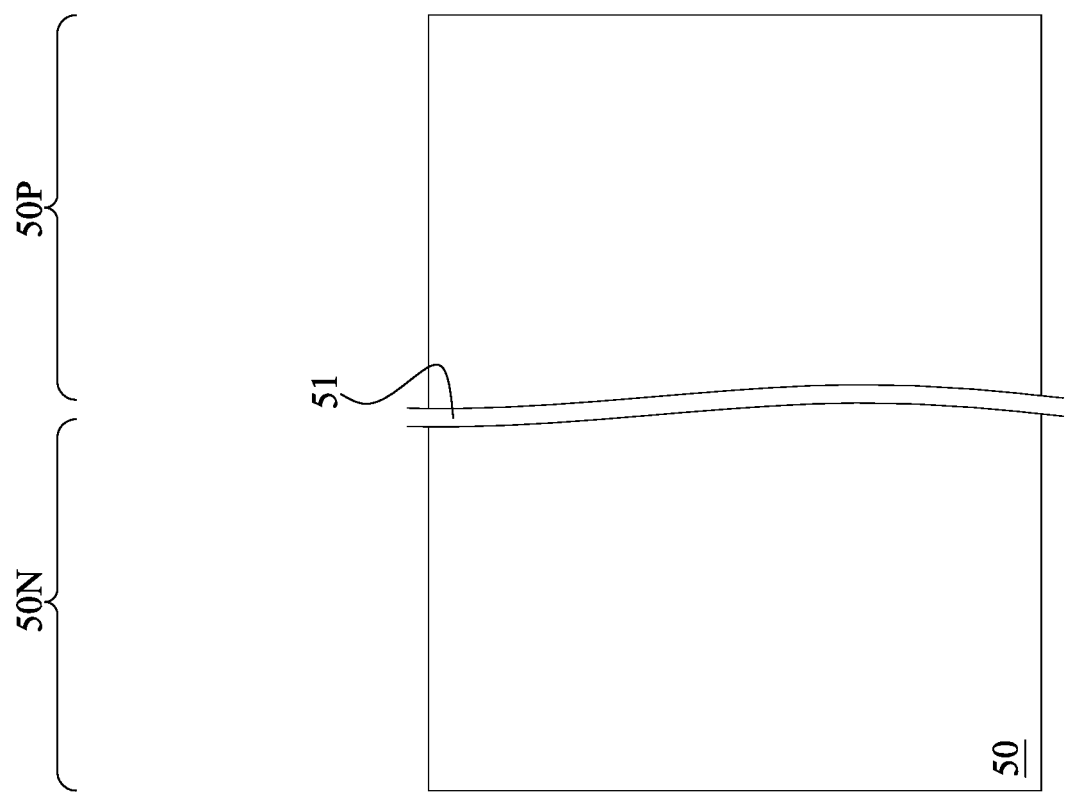

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
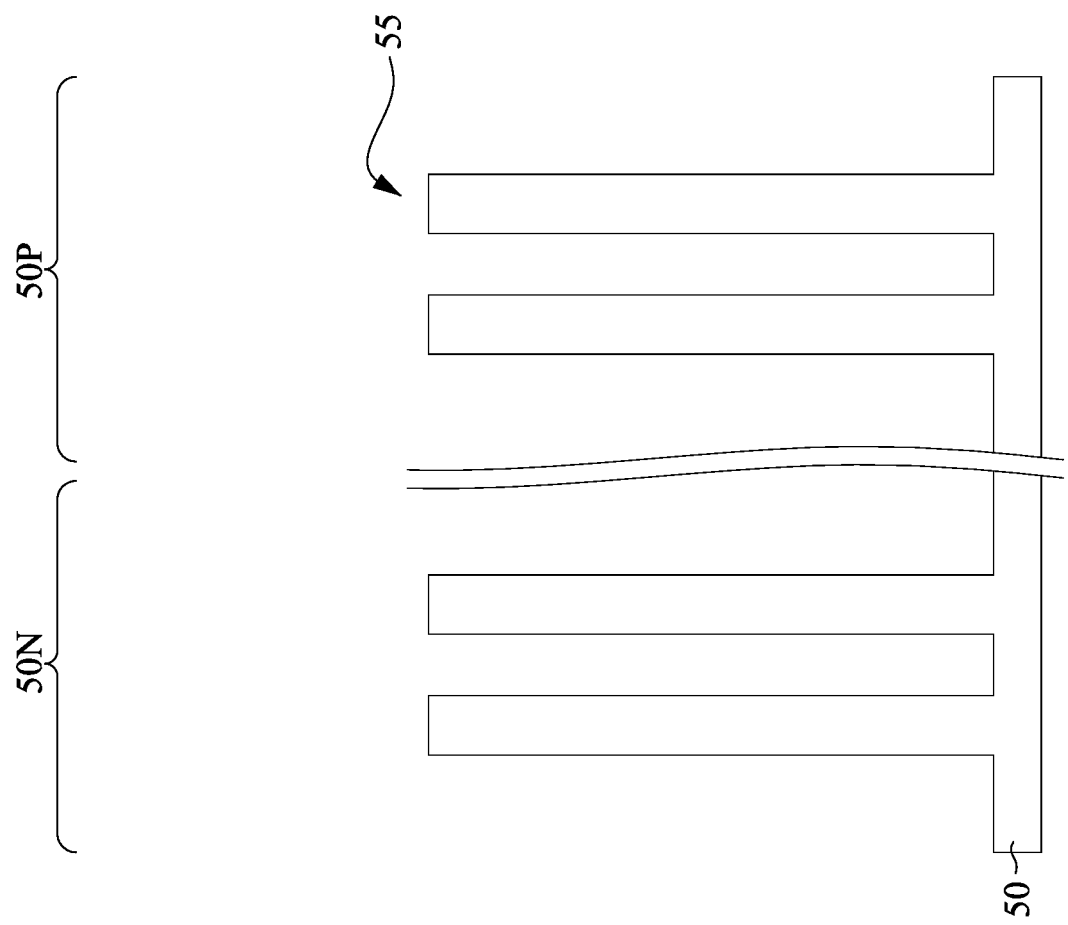

In FIG. 3, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55.

Figure 4:
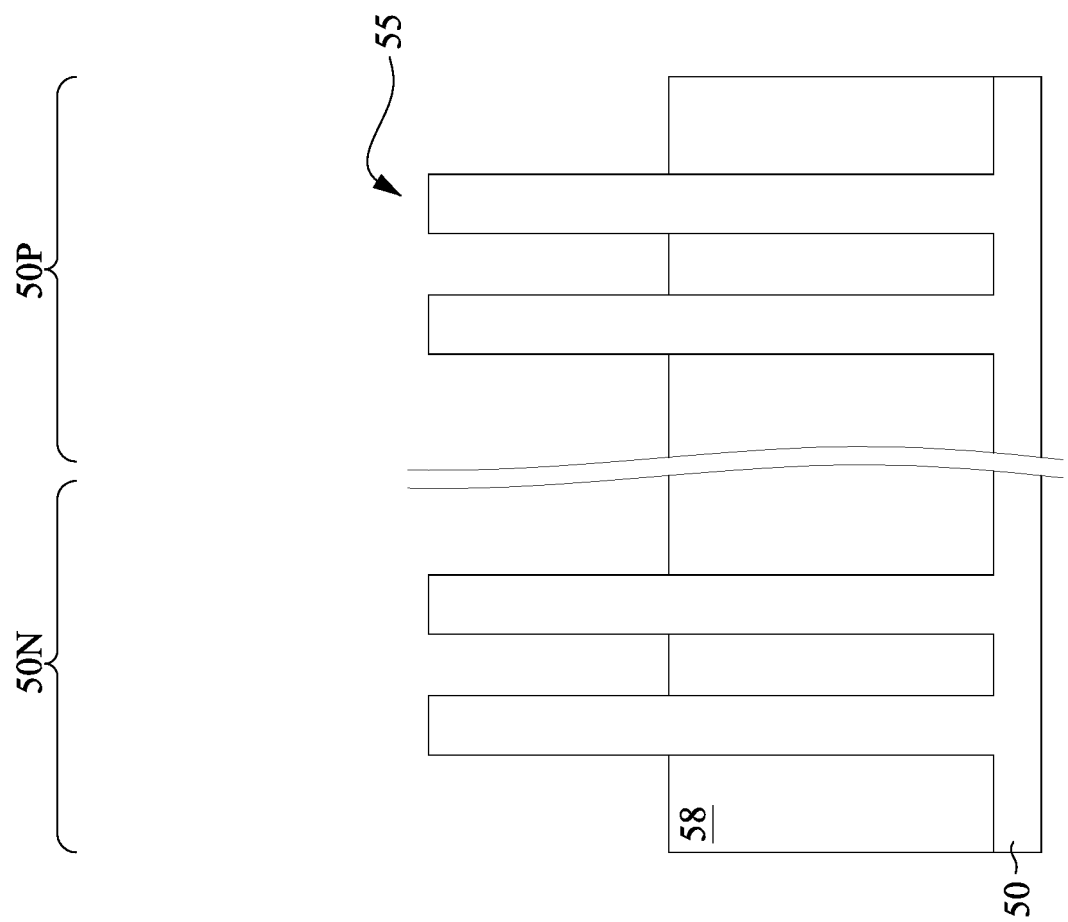

In FIG. 4, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments, a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used.

The process described with respect to FIGS. 2 through 4 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 55. For example, the fins 55 in FIG. 4 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 55 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist or other masks (not separately illustrated). For example, a photoresist may be formed over the fins 55 and the STI regions 58 in the n-type region 50N. The photoresist is patterned to expose the p-type region 50P of the substrate 50, such as a PMOS region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N, such as an NMOS region. The n-type impurities may be phosphorus, arsenic, antimony, or the like implanted in the region to a concentration of equal to or less than $1 \times 10^{18}$ atoms/$cm^3$, such as between about $1 \times 10^{16}$ atoms/$cm^3$ and about $1 \times 10^{18}$ atoms/$cm^3$. After the implant, the photoresist is removed, such as by an acceptable ashing process.

Following the implanting of the p-type region 50P, a photoresist is formed over the fins 55 and the STI regions 58 in the p-type region 50P. The photoresist is patterned to expose the n-type region 50N of the substrate 50, such as the NMOS region. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P, such as the PMOS region. The p-type impurities may be boron, boron fluoride, indium, or the like implanted in the region to a concentration of equal to or less than $1 \times 10^{18}$ atoms/$cm^3$, such as between about $1 \times 10^{16}$ atoms/$cm^3$ and about $1 \times 10^{18}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
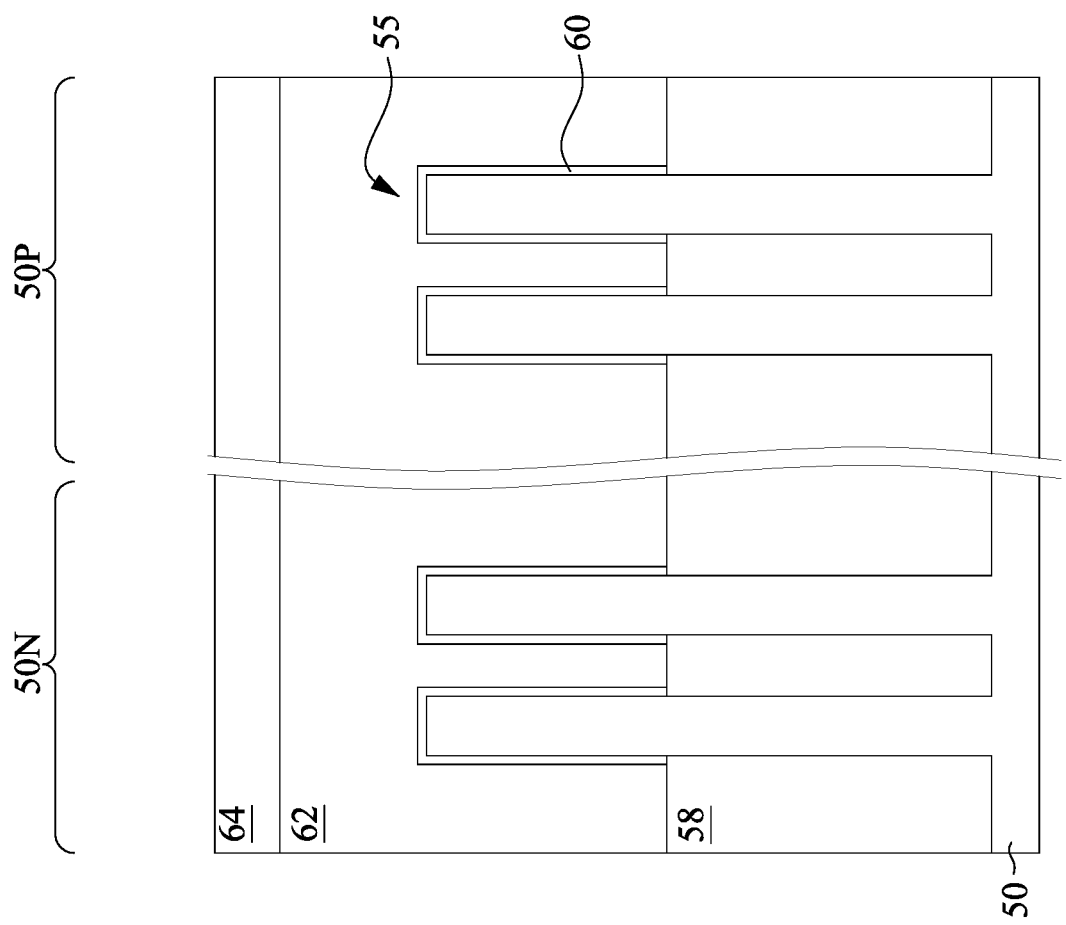

In FIG. 5, dummy dielectric layers 60 are formed on the fins 55. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60 and a mask layer 64 is formed over the dummy gate layer 62. The dummy gate layer 62 may be deposited over the dummy dielectric layers 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 58 and/or the dummy dielectric layers 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layers 60 are shown covering only the fins 55 for illustrative purposes only. In some embodiments, the dummy dielectric layers 60 may be deposited such that the dummy dielectric layers 60 cover the STI regions 58, extending over the STI regions 58 and between the dummy gate layer 62 and the STI regions 58.

FIGS. 6A through 32B illustrate various additional steps in the manufacturing of embodiment devices. FIGS. 6A through 32B illustrate features in either of the n-type region 50N or the p-type region 50P. For example, the structures illustrated in FIGS. 6A through 32B may be applicable to both the n-type region 50N and the p-type region 50P. Differences (if any) in the structures of the n-type region 50N and the p-type region 50P are described in the text accompanying each figure.

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates 72. The dummy gates 72 may also have a lengthwise direction substantially perpendicular to the lengthwise direction of respective fins 55. The dummy dielectric layers 60, the dummy gates 72, and the masks 74 may be collectively referred to as "dummy gate stacks."

Figure 7B:
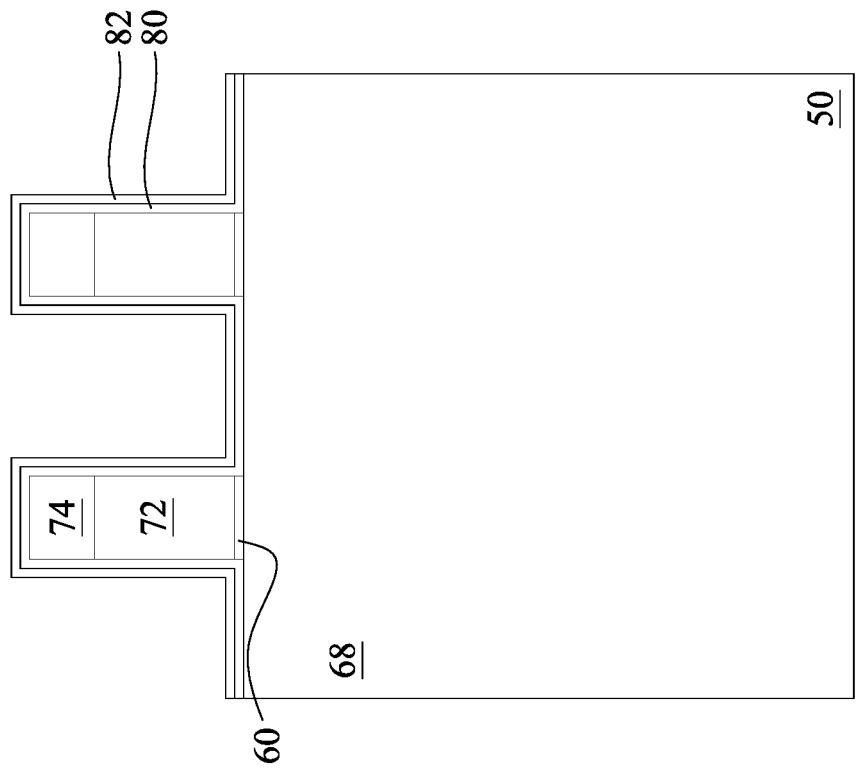
Figure 7A:
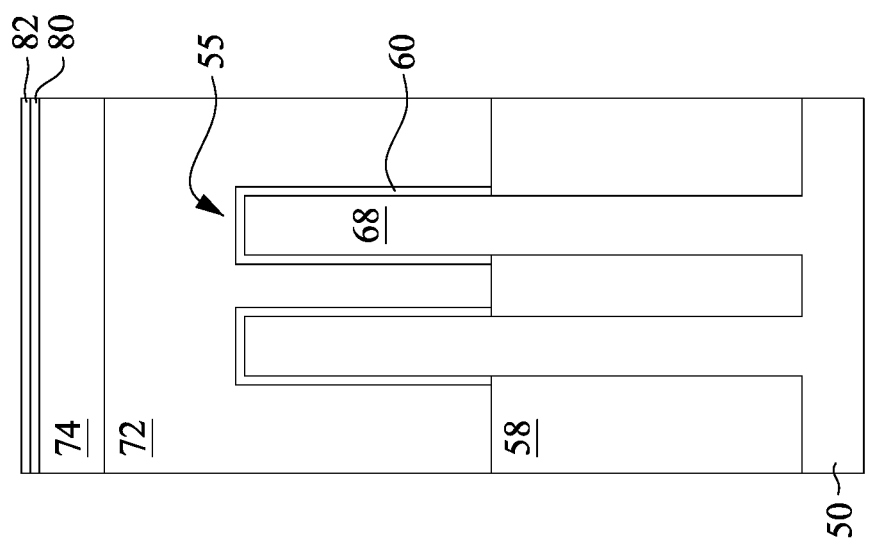
Figure 7C:
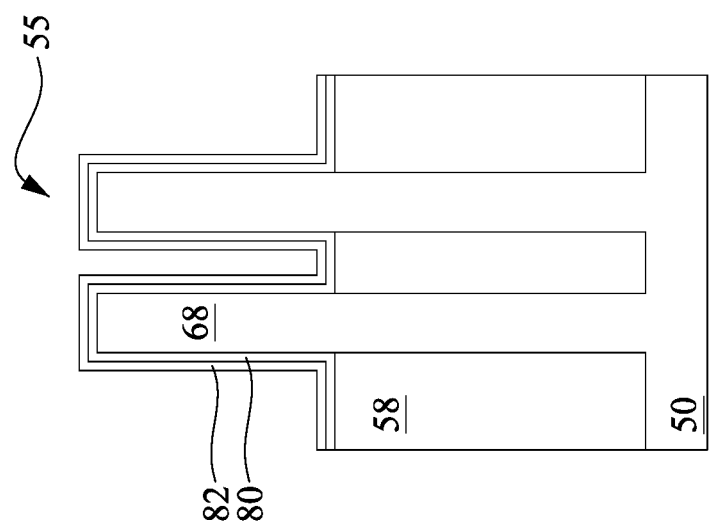

In FIGS. 7A through 7C, a first spacer layer 80 and a second spacer layer 82 are formed over the structures illustrated in FIGS. 6A and 6B. In FIGS. 7A through 7C, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8C:
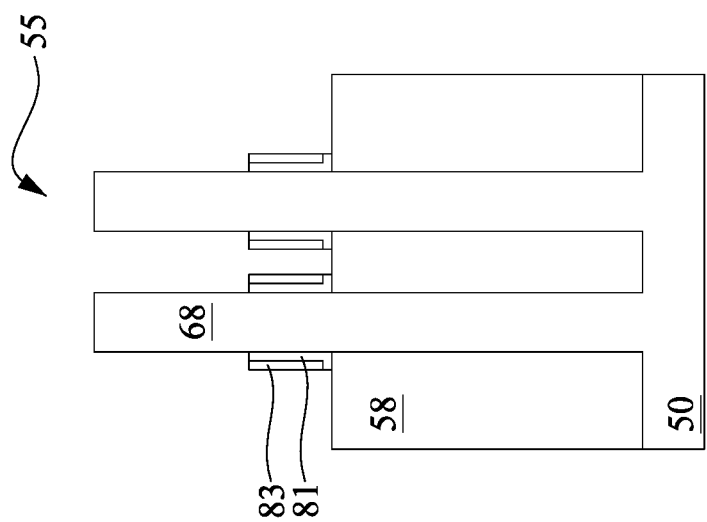

In FIGS. 8A through 8C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dummy dielectric layers 60, the dummy gates 72, and the masks 74. The first spacers 81 and the second spacers 83 may have different heights adjacent the fins 55 and the dummy gate stacks due to the etching processes used to etch the first spacer layer 80 and the second spacer layer 82, as well as differing heights between the fins 55 and the dummy gate stacks. Specifically, as illustrated in FIGS. 8A through 8C, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 55 and the substrate 50 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 55 and the substrate 50 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figure 9B:
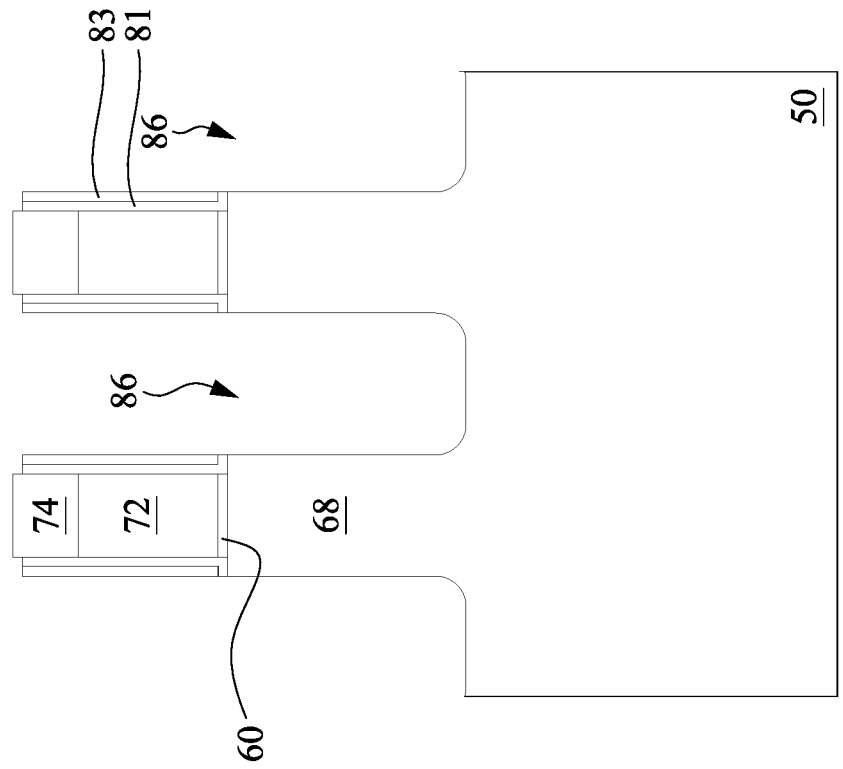
Figure 9A:
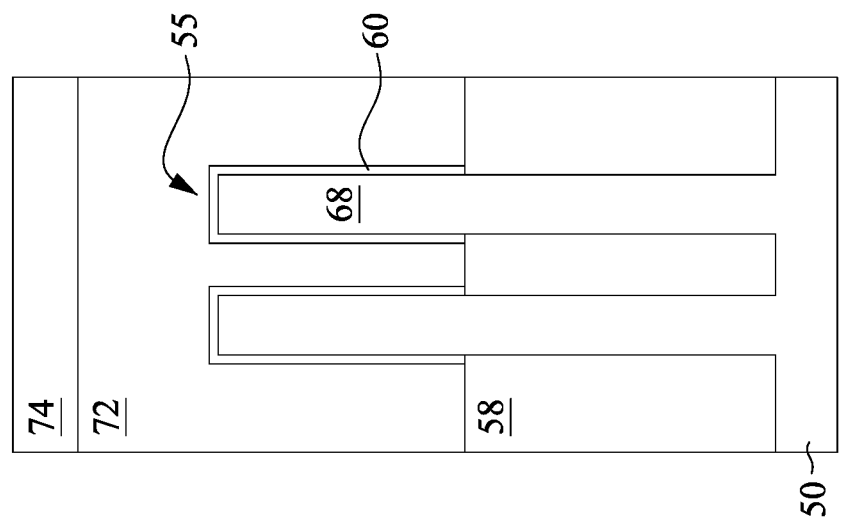

In FIGS. 9A through 9C, first recesses 86 are formed in the fins 55 and the substrate 50. As illustrated in FIG. 9C, top surfaces of the STI regions 58 may be level with top surfaces of the substrate 50. The substrate 50 may be etched such that bottom surfaces of the first recesses 86 are disposed above or below the top surfaces of the STI regions 58. The first recesses 86 may be formed by etching the fins 55 and the substrate 50 using anisotropic etching processes, such as RIE, NBE, or the like. The first spacers 81, the second spacers 83, and the masks 74 mask portions of the fins 55 and the substrate 50 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 10B:
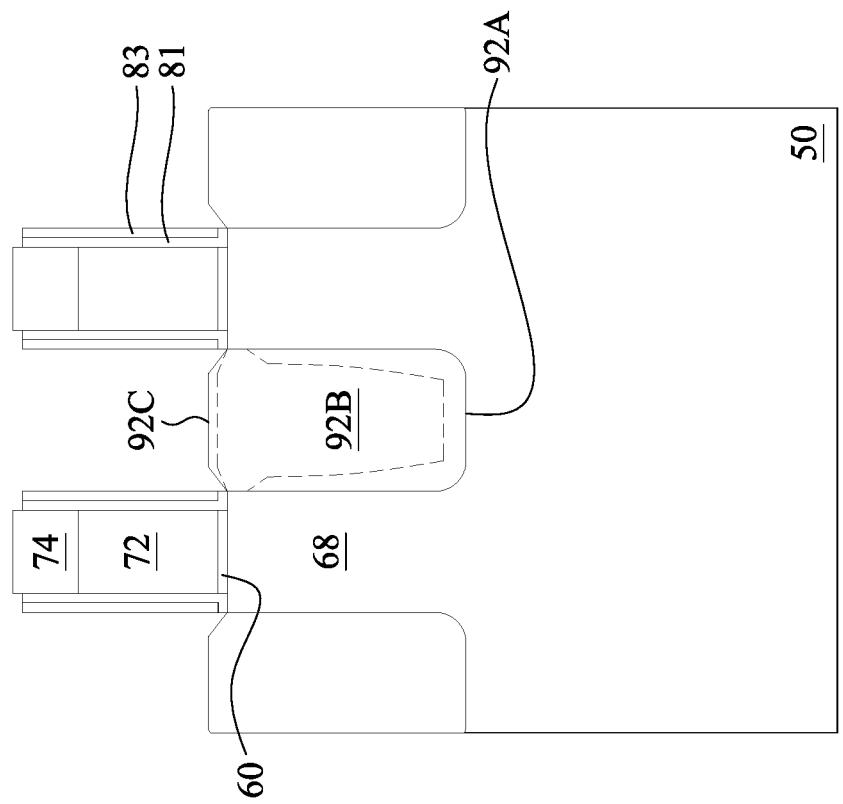

In FIGS. 10A-10D, epitaxial source/drain regions 92 are formed in the first recesses 86 to exert stress on the channel regions 68 of the fins 55, thereby improving performance. As illustrated in FIG. 10B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 10C. In some embodiments, adjacent epitaxial source/drain regions 92 remain separated after the epitaxy process is completed as illustrated by FIG. 10D. In the embodiments illustrated in FIGS. 10C and 10D, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 10A:
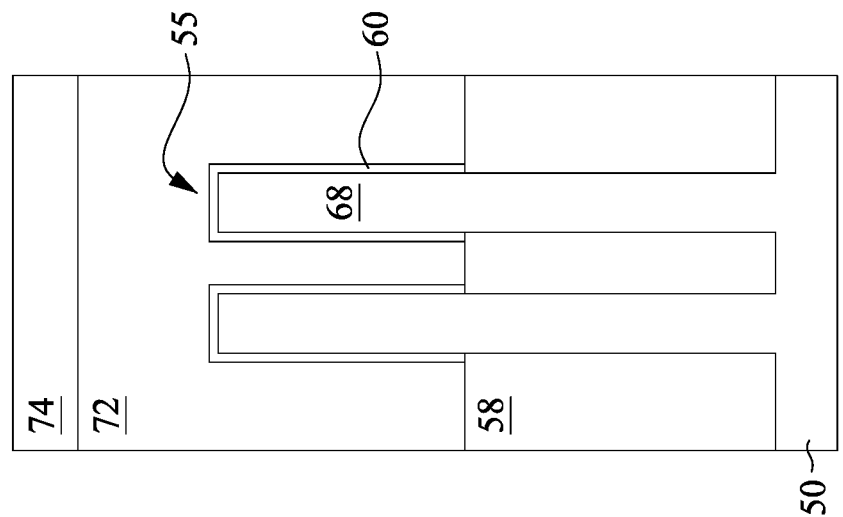
Figure 10C:
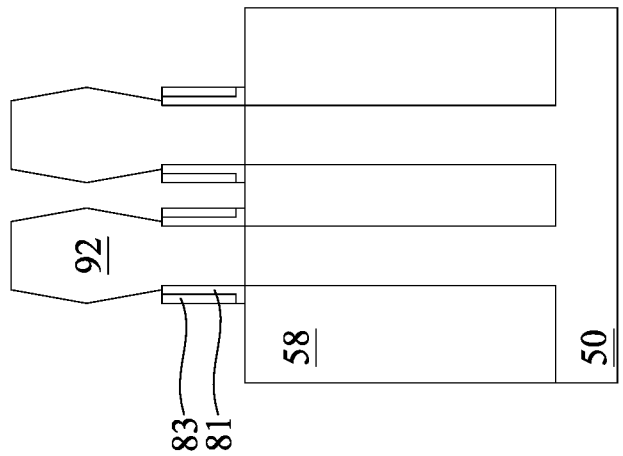
Figure 10D:
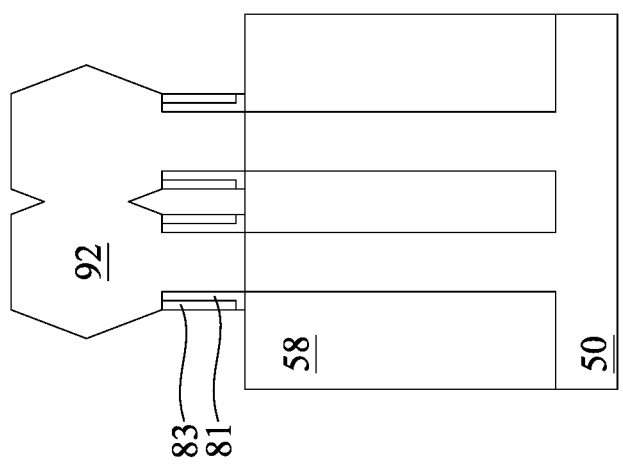
Figure 11B:
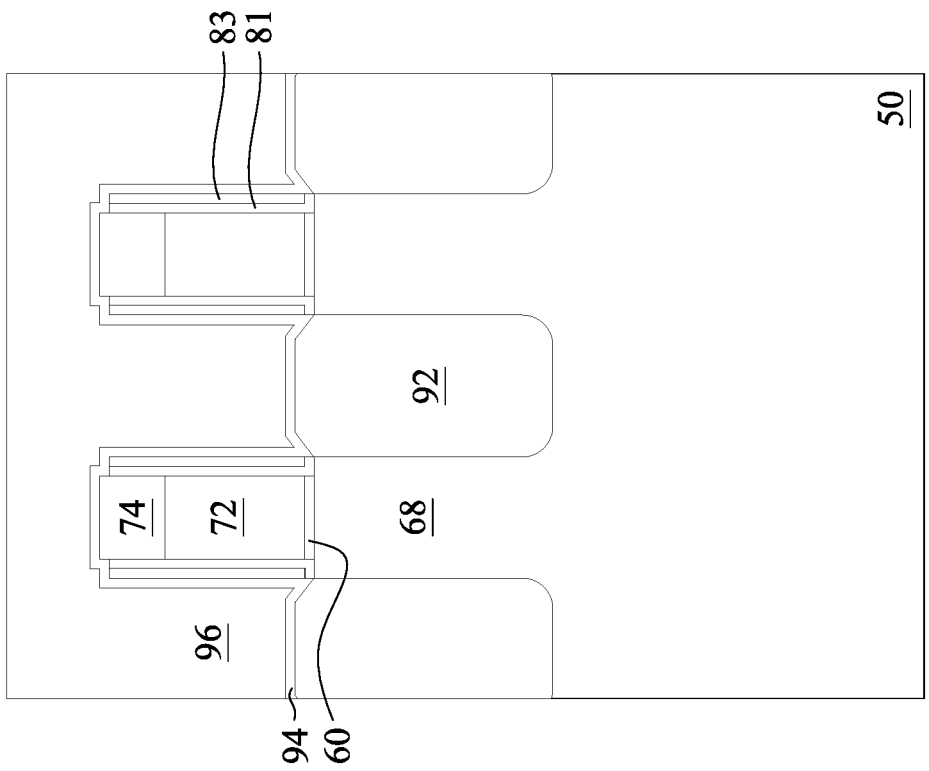
Figure 11A:
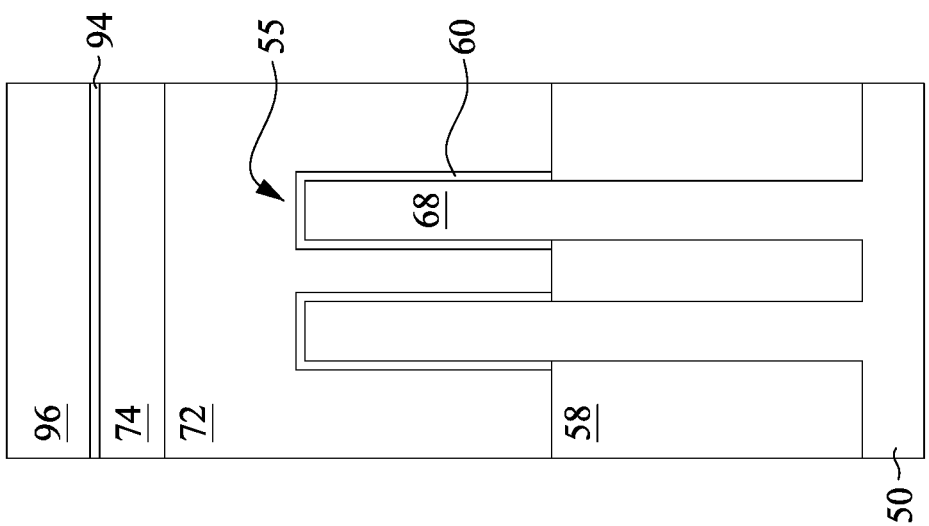

In FIGS. 11A and 11B, a first interlayer dielectric (ILD) 96 is deposited over the structure illustrated in FIGS. 10A and 10B, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 12B:
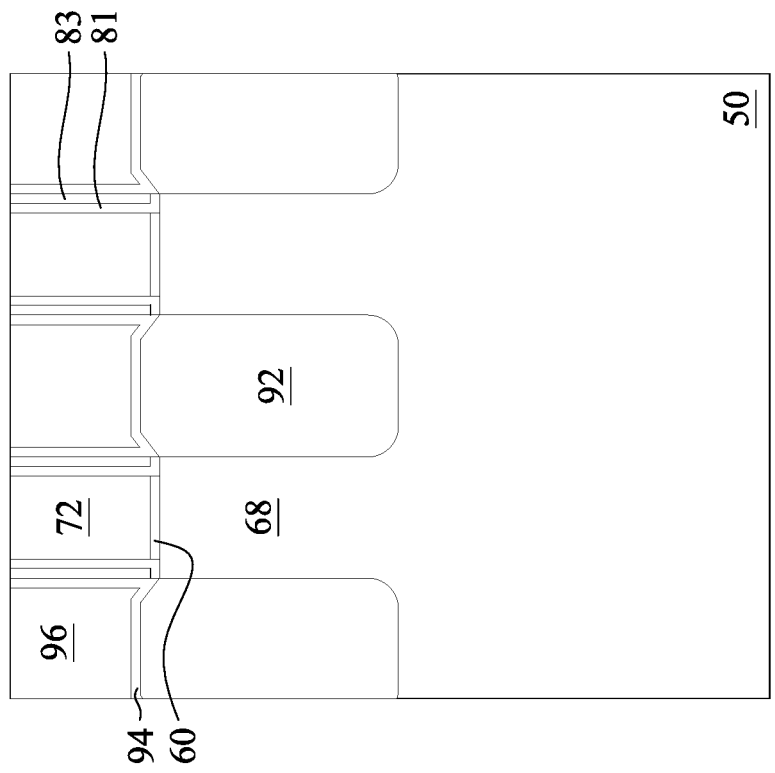
Figure 12A:
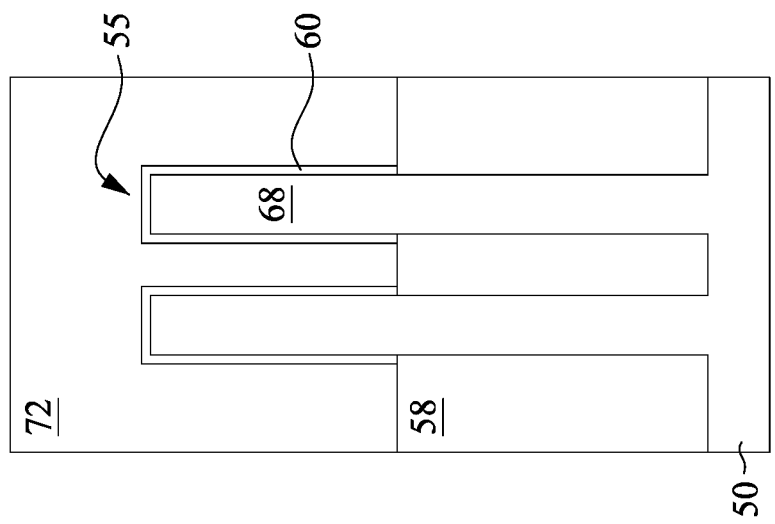

In FIGS. 12A and 12B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 13B:
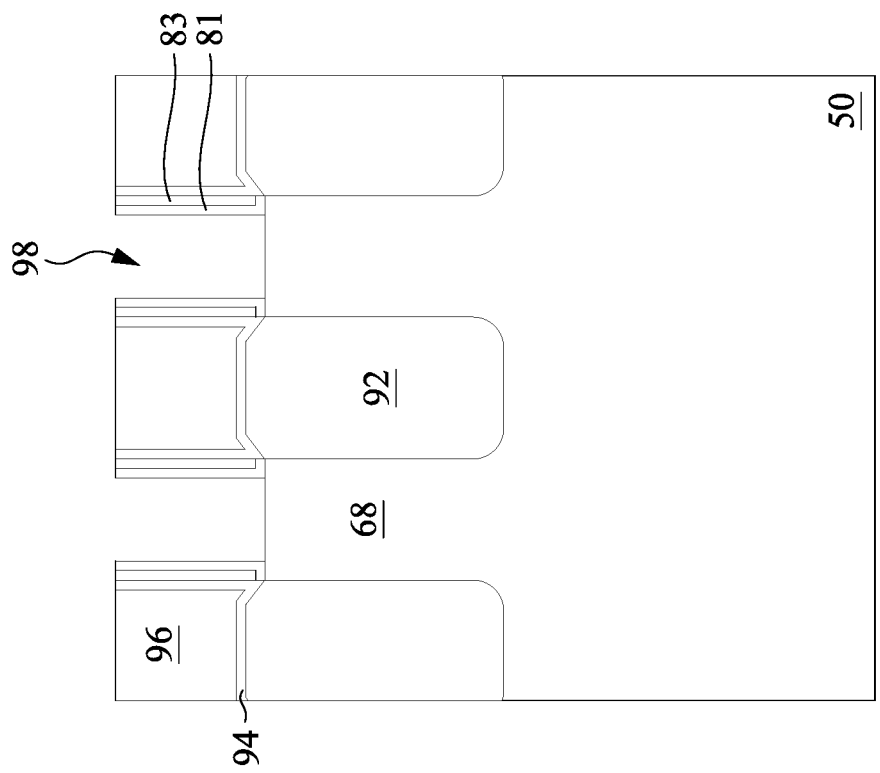
Figure 13A:
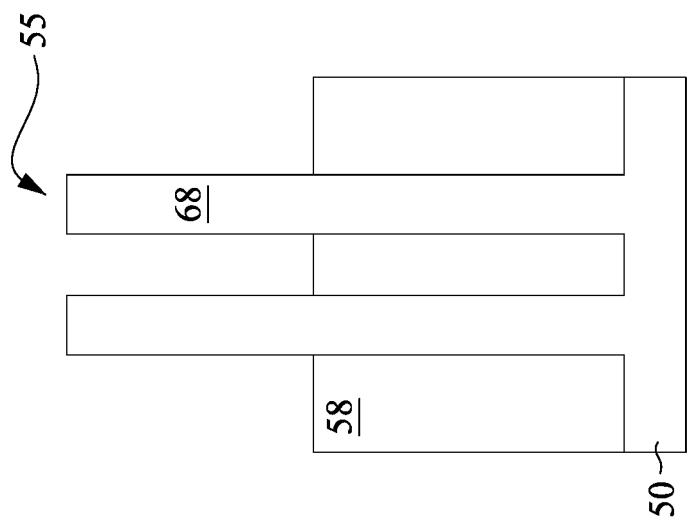

In FIGS. 13A and 13B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies a channel region 68 of a respective fin 55. Each channel region 68 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

Figure 14B:
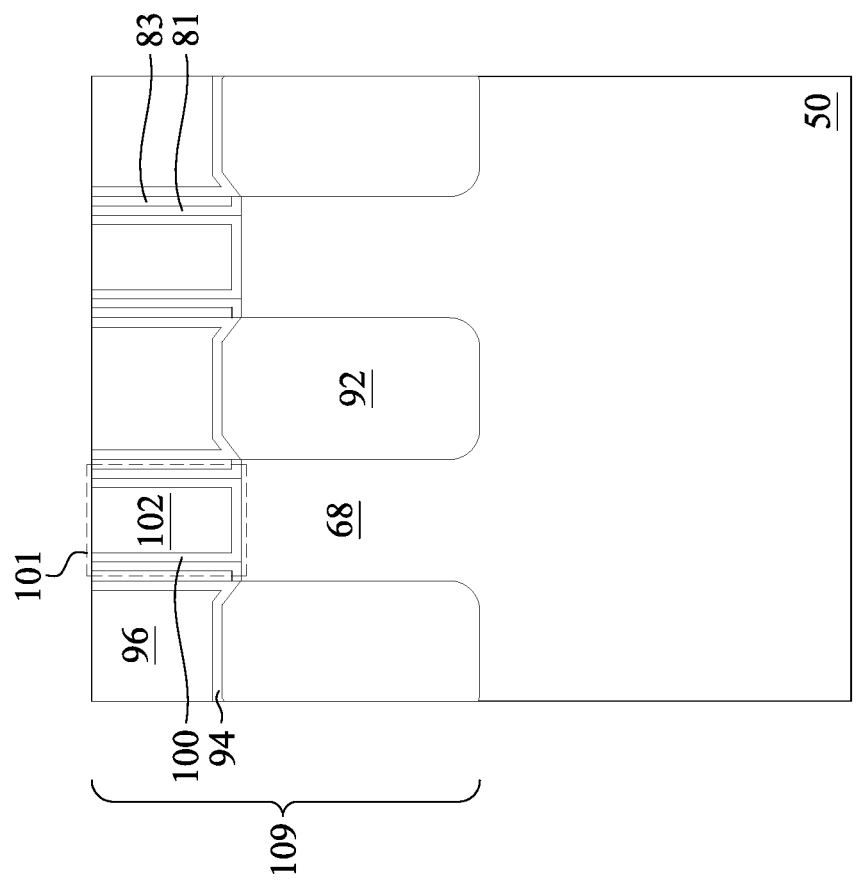
Figure 14A:
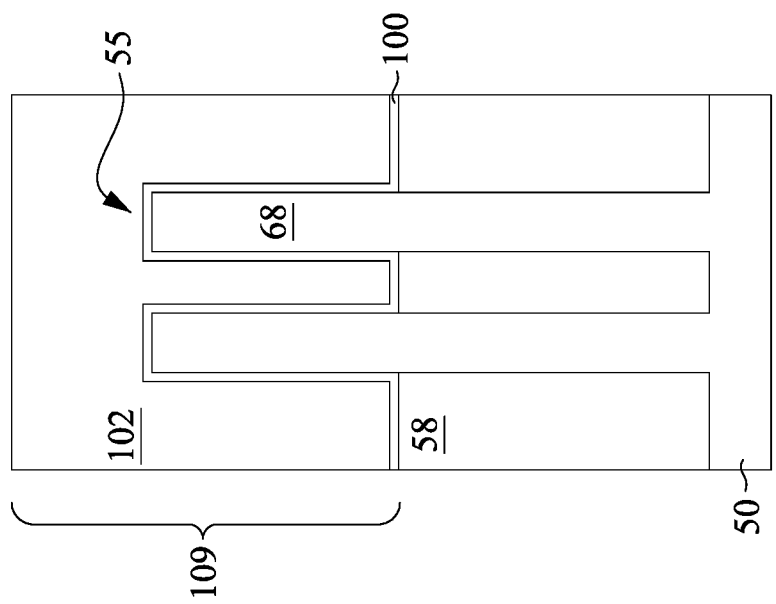
Figure 14C:
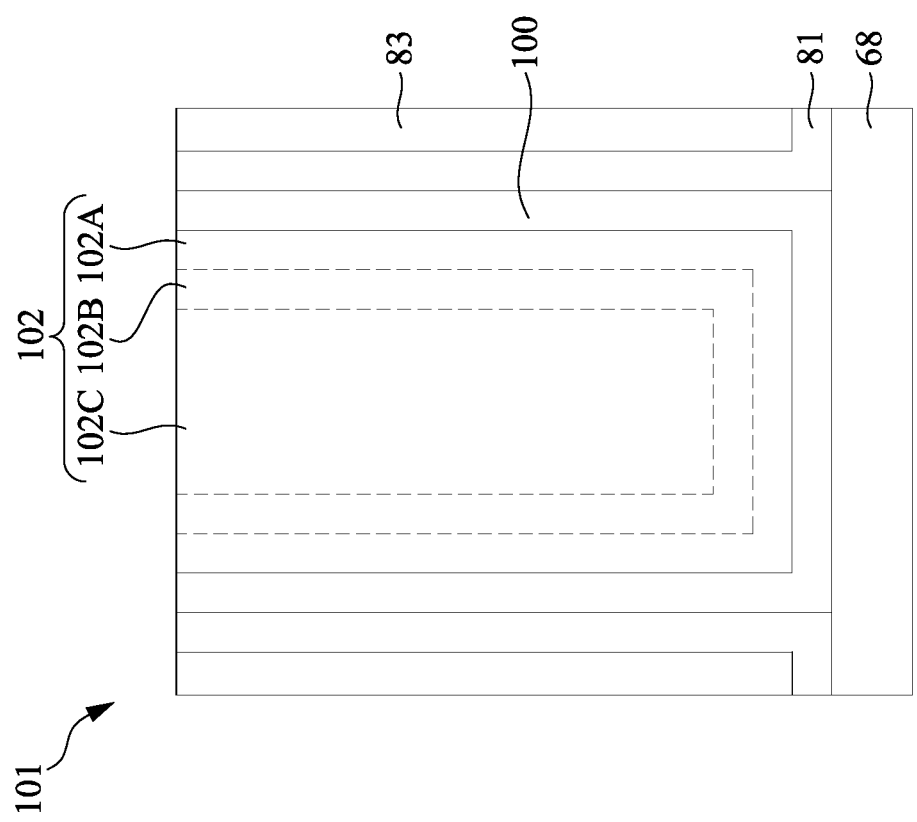

In FIGS. 14A through 14C, gate dielectric layers 100 and gate electrodes 102 are formed for replacement gates. FIG. 14C illustrates a detailed view of region 101 of FIG. 14B. The gate dielectric layers 100 may include one or more layers deposited in the second recesses 98, such as on top surfaces and sidewalls of the fins 55, on top surfaces and sidewalls of the first spacers 81, and on top surfaces of the second spacers 83. The gate dielectric layers 100 may also be formed on top surfaces of the first ILD 96, the CESL 94, and the STI regions 58. In some embodiments, the gate dielectric layers 100 comprise one or more dielectric layers, such as one or more layers of silicon oxide, silicon nitride, metal oxide, metal silicate, or the like. In some embodiments, the gate dielectric layers 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 100 may include a dielectric layer having a k-value greater than about 7.0. The formation methods of the gate dielectric layers 100 may include molecular-beam deposition (MBD), ALD, PECVD, and the like. In embodiments where portions of the dummy dielectric layers 60 remain in the second recesses 98, the gate dielectric layers 100 may include a material of the dummy dielectric layers 60 (e.g., silicon oxide).

The gate electrodes 102 are deposited over the gate dielectric layers 100 and fill remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. Although a single layer gate electrode 102 is illustrated in FIG. 14B, the gate electrode 102 may comprise any number of liner layers 102A, any number of work function tuning layers 102B, and a fill material 102C, as illustrated in FIG. 14C.

After the filling of the second recesses 98, a planarization process, such as a CMP, may be performed to remove the excess portions of the gate dielectric layers 100 and the gate electrodes 102, which excess portions are over top surfaces of the first ILD 96. The remaining portions of the gate electrodes 102 and the gate dielectric layers 100 form replacement gates of the resulting FinFETs. The gate electrodes 102 and the gate dielectric layers 100 may be collectively referred to as "gate stacks." The gate stacks may extend along sidewalls of the channel regions 68 of the fins 55.

The formation of the gate dielectric layers 100 in the n-type region 50N and the p-type region 50P may occur simultaneously such that the gate dielectric layers 100 in each region are formed from the same materials. The formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 in the n-type region 50N and the p-type region 50P may be different materials. In some embodiments, the gate electrodes 102 in each region may be formed by distinct processes, such that the gate electrodes 102 in the n-type region 50N and the p-type region 50P may be different materials. Various masking steps may be used to mask and expose appropriate regions when using the distinct processes.

The epitaxial source/drain regions 92, channel regions 68 of the fins 55, and the gate stacks (including the gate dielectric layers 100 and the gate electrodes 102) may collectively be referred to as transistor structures 109. As will be discussed below with respect to FIGS. 15A through 32B, portions of the gate stacks may be replaced by capacitors to form 1T-1C memory cells (e.g., FERAM memory cells). Although the transistor structures 109 are described as including FinFETs, other embodiments may include transistor structures 109 including different types of transistors (e.g., planar FETs, nano-FETs, thin film transistors (TFTs), or the like).

In FIGS. 15A and 15B, the gate stacks (including the gate dielectric layers 100 and the gate electrodes 102) are recessed, so that third recesses 103 are formed directly over the gate stack and between opposing portions of first spacers 81. The gate stacks may be recessed by an etching process such as an isotropic etching process (e.g., a wet etching process), an anisotropic etching process (e.g., a dry etching process), multiple processes or combinations thereof, or the like. The etching process may be an etching process which is selective to the material of the gate dielectric layers 100 and the gate electrodes 102 (e.g., etches the materials of the gate dielectric layers 100 and the gate electrodes 102 at a faster rate than materials of the first ILD 96, the CESL 94, the first spacers 81, and the second spacers 83). As such, the gate dielectric layers 100 and the gate electrodes 102 may be etched to form the third recesses 103, while the first ILD 96, the CESL 94, the first spacers 81, and the second spacers 83 remain relatively un-etched. The third recesses 103 may have heights Hi from about 5 nm to about 50 nm.

In FIGS. 16A and 16B, a first dielectric layer 104 is formed in the third recesses 103 over the gate stacks. The first dielectric layer 104 may be deposited by any suitable method, such as CVD, ALD, or the like. The first dielectric layer 104 may include silicon oxide, silicon nitride, or the like. After the filling of the third recesses 103, a planarization process, such as a CMP, may be performed to remove excess portions of the first dielectric layer 104, which excess portions are over top surfaces of the first ILD 96. As such, top surfaces of the first dielectric layer 104, the first spacers 81, the second spacers 83, the CESL 94, and the first ILD 96 may be level with one another. The first dielectric layer 104 may have heights Hi from about 5 nm to about 50 nm.

Figure 17B:
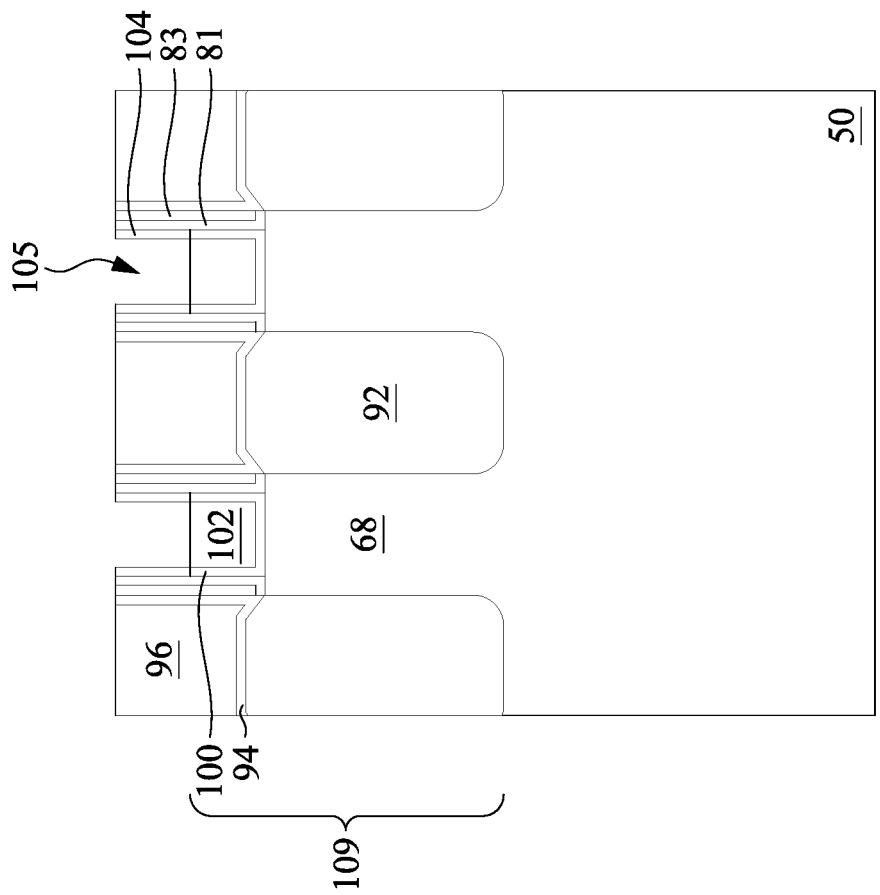
Figure 17A:
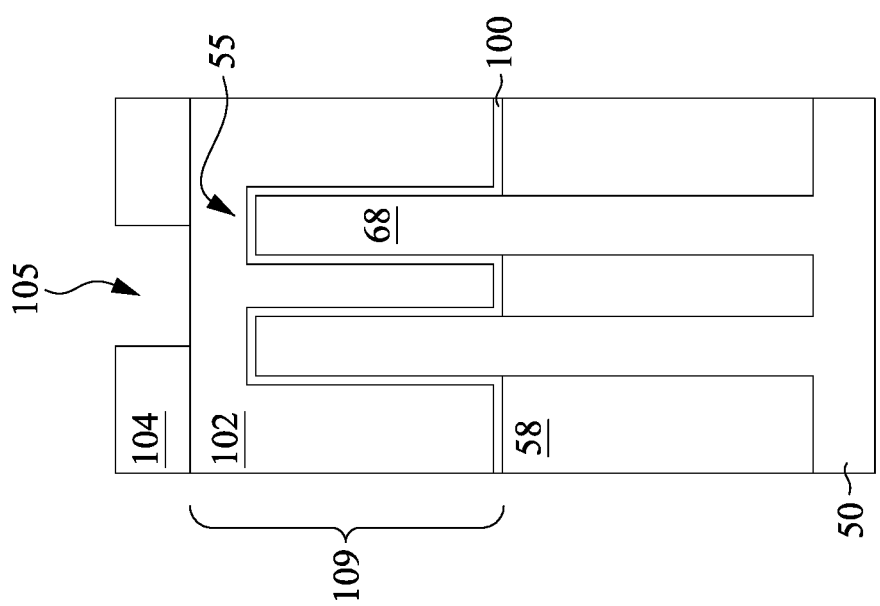

In FIGS. 17A and 17B, fourth recesses 105 are patterned through the first dielectric layer 104. The fourth recesses 105 may be patterned in the first dielectric layer 104 through a combination of photolithography and etching. The etching may be any acceptable etching processes, such as wet or dry etching, RIE, NBE, the like, or a combination thereof. The etching may be anisotropic. The fourth recesses 105 may be disposed between opposing sidewalls of the first dielectric layer 104. The fourth recesses 105 may expose top surfaces of the gate electrodes 102. In some embodiments, the fourth recesses 105 may also expose top surfaces of the gate dielectric layers 100.

Figure 18B:
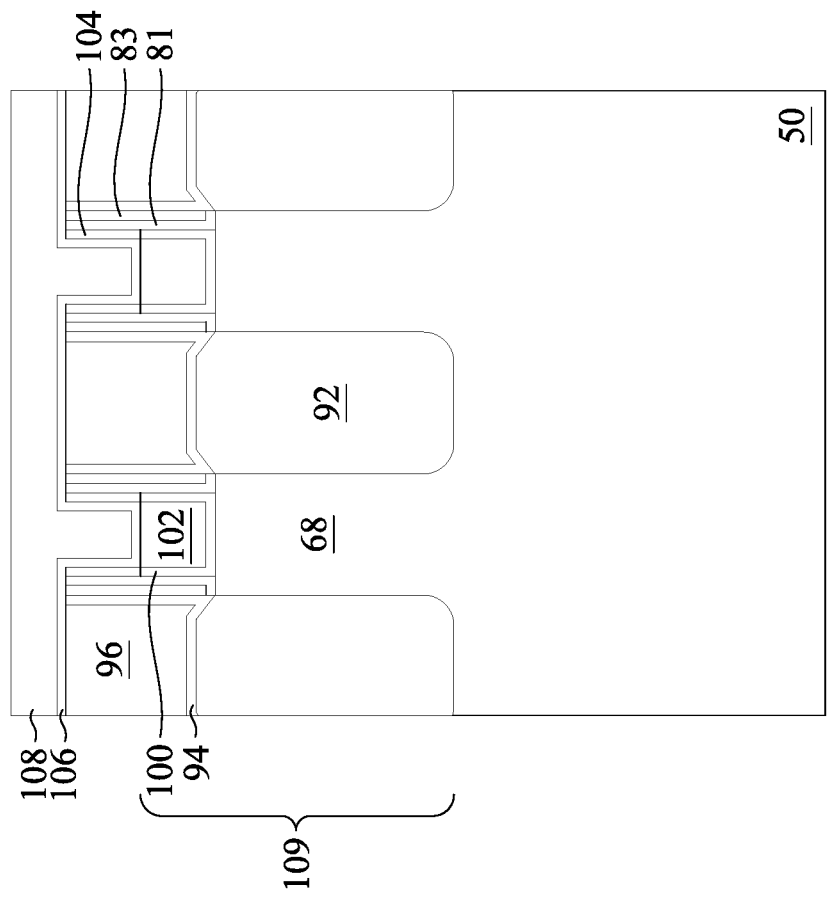
Figure 18A:
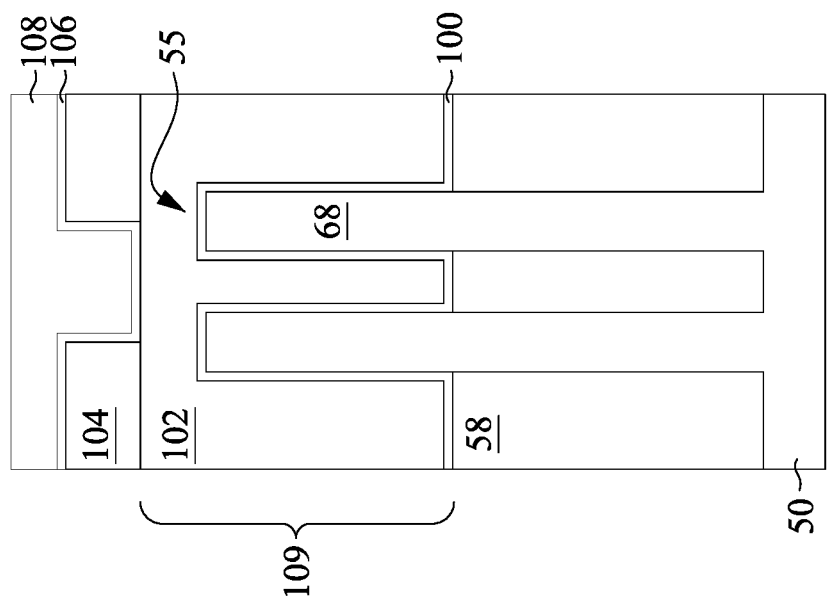

In FIGS. 18A and 18B, a first electrode layer 106 and a first hard mask layer 108 are formed in the fourth recesses 105 and extending over the first dielectric layer 104, the first ILD 96, the CESL 94, the first spacers 81, and the second spacers 83. The first electrode layer 106 may be deposited by a conformal deposition process, such as CVD, ALD, or the like. The first electrode layer 106 may be a conductive material, such as titanium nitride (TiN), ruthenium (Ru), tantalum (Ta), titanium (Ti), aluminum (Al), tungsten (W), combinations thereof, or the like. The first electrode layer 106 may have a thickness from about 1 nm to about 15 nm. The first hard mask layer 108 may be deposited by spin-on-coating or the like. The first hard mask layer 108 may include a polymer material, such as poly(methyl)acrylate, poly(maleimide), novolacs, poly(ether)s, combinations thereof, or the like. In some embodiments, the first hard mask layer 108 may be a bottom anti-reflective coating (BARC) material.

Figure 19B:
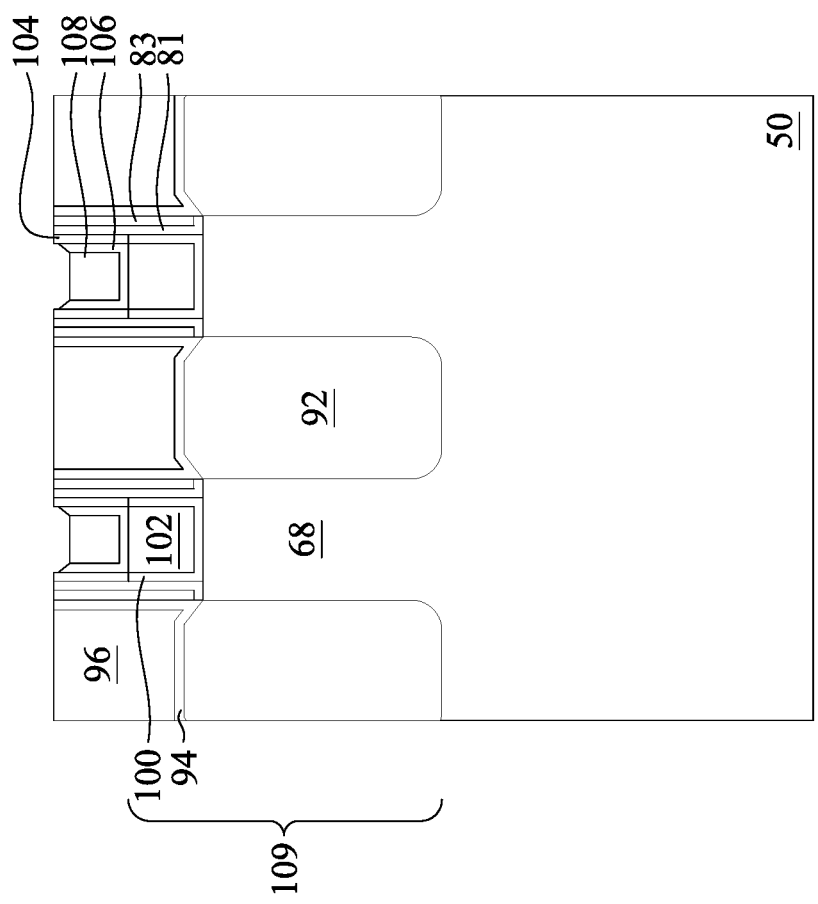
Figure 19A:
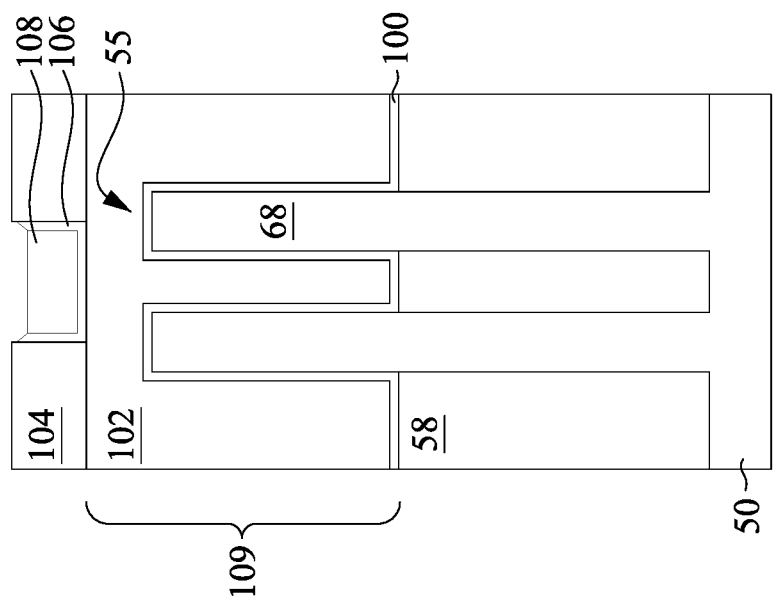

In FIGS. 19A and 19B, the first hard mask layer 108 and the first electrode layer 106 are etched. The first hard mask layer 108 and the first electrode layer 106 may be etched by one or more etching processes, such as isotropic etching processes (e.g., wet etching processes), anisotropic etching processes (e.g., dry etching processes), combinations thereof, or the like. In some embodiments, the first hard mask layer 108 may be etched by a first etching process to expose top portions and sidewall portions of the first electrode layer 106. The first electrode layer 106 may then be etched by a second etching process using the first hard mask layer 108 as a mask. In some embodiments, the first etching process and the second etching process may be isotropic etching processes. In some embodiments, the first electrode layer 106 and the first hard mask layer 108 may be etched simultaneously.

As illustrated in FIGS. 19A and 19B, after the first hard mask layer 108 and the first electrode layer 106 are etched, top surfaces of the first hard mask layer 108 and the first electrode layer 106 are disposed below top surfaces of the first dielectric layer 104, the first ILD 96, the CESL 94, the first spacers 81, and the second spacers 83. Moreover, the top surfaces of the first electrode layer 106 may be disposed below the top surfaces of the first hard mask layer 108. The top surfaces of the first electrode layer 106 may be straight and inclined, as illustrated in FIGS. 19A and 19B; however, in some embodiments, the top surfaces of the first electrode layer 106 may be horizontal, may be curved, or the like. Etching the first electrode layer 106 such that top surfaces of the first electrode layer 106 are below the top surfaces of the first ILD 96, the CESL 94, the first spacers 81, and the second spacers 83 helps to isolate the first electrode layer 106 from subsequently formed contacts (such as the contacts 116, discussed below with respect to FIGS. 23A and 23B), which prevents shunting, reduces device errors, and improves device performance. Moreover, the first hard mask layer 108 protects sidewall portions and bottom portions of the first electrode layer 106 from etching such that the first electrode layer 106 may be used as a bottom electrode in a subsequently completed FE capacitor. As illustrated in FIGS. 19A and 19B, the first electrode layer 106 may be U-shaped, which may increase the capacitance (e.g., capacitor area) of a subsequently formed capacitor.

In FIGS. 20A and 20B, the first hard mask layer 108 is removed and a memory film 110 and a second electrode layer 112 are formed over the first electrode layer 106, the first dielectric layer 104, the first ILD 96, the CESL 94, the first spacers 81, and the second spacers 83. The first hard mask layer 108 may be removed by plasma ashing, an etching process such as an isotropic or an anisotropic etching process, or the like.

The memory film 110 may be deposited by CVD, ALD, or the like. The memory film 110 may comprise a material that is capable of switching between two different polarization directions by applying an appropriate voltage differential across the memory film 110. The memory film 110 may be a high-k dielectric material. In some embodiments, the memory film 110 comprises a ferroelectric (FE) material, such as a metal-oxide (e.g., hafnium oxide ($Hf_xO_y$) or the like), a component-metal-oxide (e.g., hafnium-silicon-oxide ($Hf_xSi_yO_z$), hafnium-aluminum-oxide ($Hf_xAl_yO_z$), hafnium-gadolinium-oxide ($Hf_xGd_yO_z$), hafnium-zirconium-oxide ($Hf_xZr_yO_z$), hafnium-lanthanum-oxide ($Hf_xLa_yO_z$), hafnium-strontium-oxide ($Hf_xSr_yO_z$), hafnium-yttrium-oxide ($Hf_xY_yO_z$), strontium titanate ($SrTiO_3$), or the like), a metal-oxynitride (e.g., hafnium oxynitride ($Hf_xO_yN_z$) or the like), multiple layers or combinations thereof, or the like. In some embodiments, the memory film 110 may comprise different ferroelectric materials or different types of memory materials. In some embodiments, the memory film 110 may be a multilayer memory structure comprising a layer of $SiN_x$ between two $SiO_x$ layers (e.g., an ONO structure). The memory film 110 may have a thickness from about 1 nm to about 20 nm.

The second electrode layer 112 may be deposited by CVD, ALD, or the like. The second electrode layer 112 may be a conductive material, such as titanium nitride (TiN), ruthenium (Ru), tantalum (Ta), titanium (Ti), aluminum (Al), tungsten (W), combinations thereof, or the like. The second electrode layer 112 may have a thickness from about 1 nm to about 15 nm.

The memory film 110 may be polarized in one of two different directions. The polarization direction may be changed by applying an appropriate voltage differential across the memory film 110 and generating an appropriate electric field. Depending on a polarization direction of the memory film 110, a threshold voltage of a corresponding FinFET varies and a digital value (e.g., a 0 or a 1) can be stored. For example, when the memory film 110 has a first electrical polarization direction, the corresponding transistor may have a relatively low threshold voltage, and when the memory film 110 has a second electrical polarization direction, the corresponding transistor may have a relatively high threshold voltage. The difference between the two threshold voltages may be referred to as the threshold voltage shift. A larger threshold voltage shift makes it easier (e.g., less error prone) to read the digital value stored in the corresponding memory cell.

As illustrated in FIGS. 20A and 20B, the memory film 110 may be deposited in contact with topmost surfaces and sidewalls of the first electrode layer 106, top surfaces and sidewalls of the first dielectric layer 104, and top surfaces of the first ILD 96, the CESL 94, the first spacers 81, and the second spacers 83. Forming the memory film 110 along topmost surfaces of sidewall portions of the first electrode layer 106 separates and isolates the first electrode layer 106 from subsequently formed contacts (such as the contacts 116, discussed below with respect to FIGS. 23A and 23B) such that shunting is prevented, device errors are reduced, and device performance is improved.

Figure 21B:
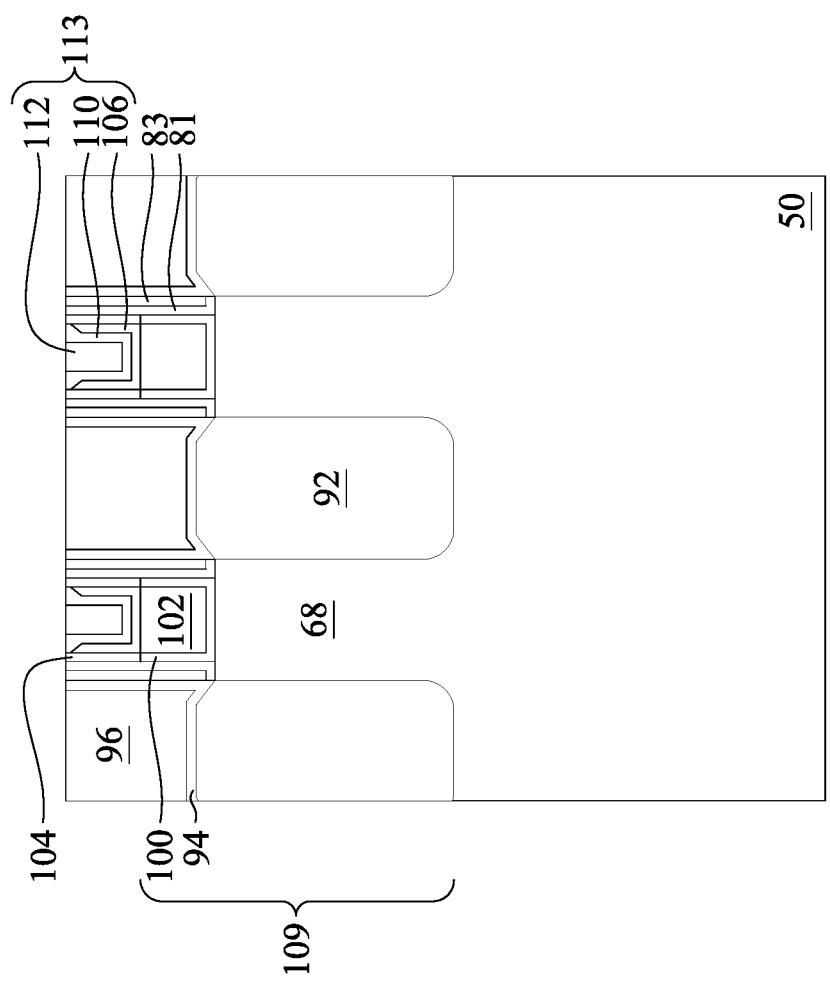
Figure 21A:
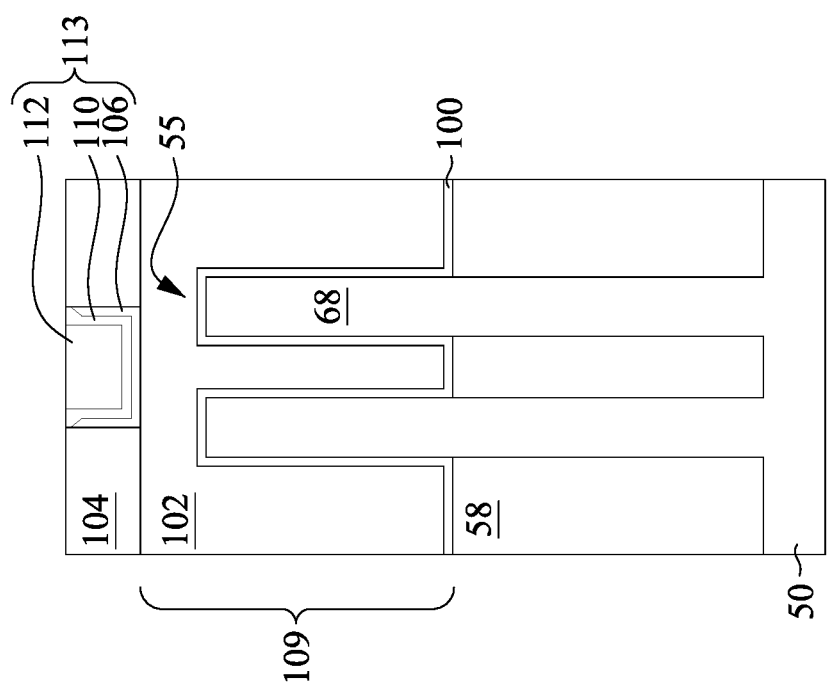

In FIGS. 21A and 21B, a planarization process, such as a CMP, is performed to level top surfaces of the memory film 110 and the second electrode layer 112 with top surfaces of the first dielectric layer 104, the first ILD 96, the CESL 94, the first spacers 81, and the second spacers 83. The planarization process may form capacitors 113 including the first electrode layer 106, the memory film 110, and the second electrode layer 112. After the planarization process, top surfaces of the memory film 110, the second electrode layer 112, the first dielectric layer 104, the first ILD 96, the CESL 94, the first spacers 81, and the second spacers 83 are level. The combination of the first electrode layer 106, the memory film 110, and the second electrode layer 112 may function as the capacitors 113 (e.g., FE capacitors) in the completed device. Each of the capacitors 113, including the first electrode layer 106, the memory film 110, and the second electrode layer 112 may be electrically coupled to the metal gate structure (e.g., the gate electrode 102) of an underlying FinFET to form a 1T-1C memory cell (e.g., a FERAM memory cell).

Figure 22B:
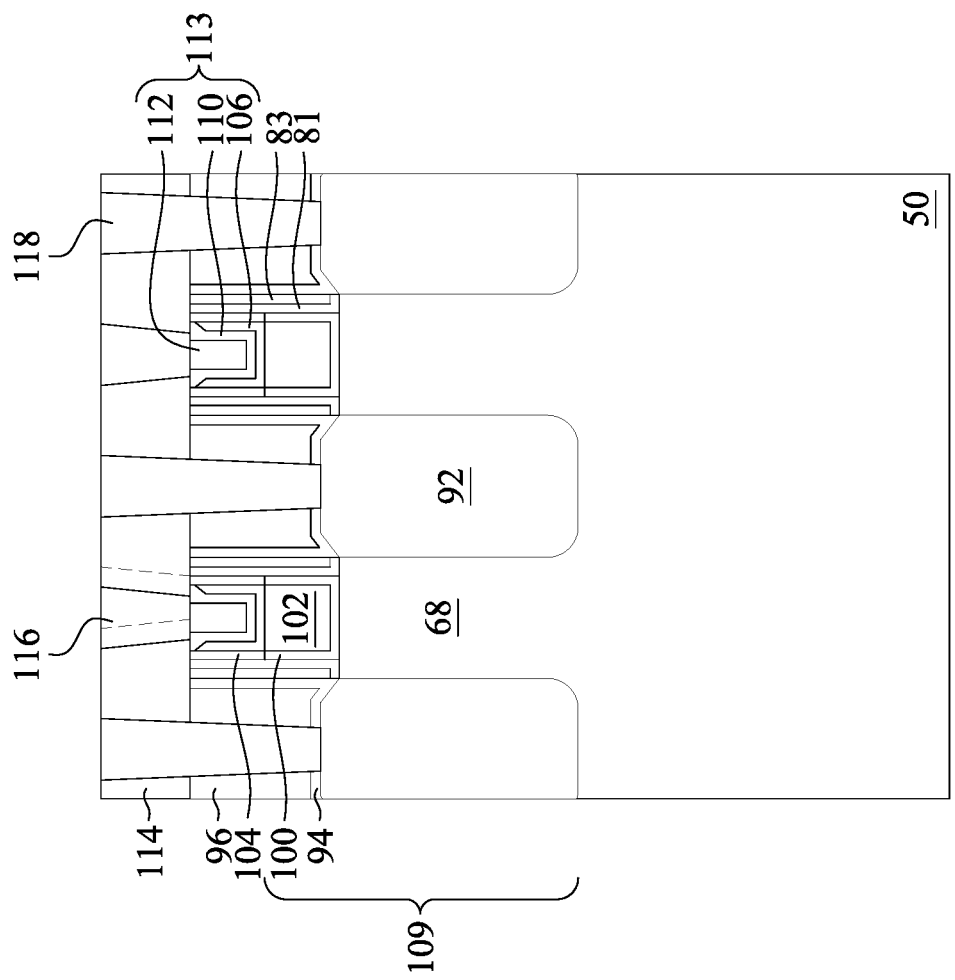
Figure 22A:
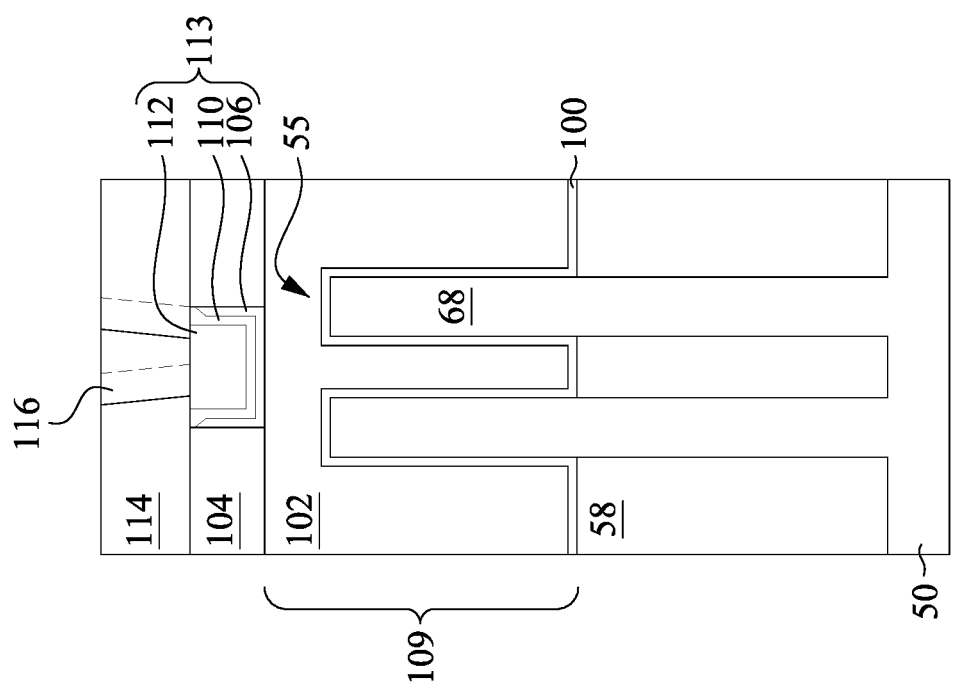

In FIGS. 22A and 22B, a second ILD 114 is deposited over the first ILD 96 and contacts 116 and contacts 118 are formed in the second ILD 114. In some embodiments, the second ILD 114 is a flowable film formed by FCVD. In some embodiments, the second ILD 114 is formed of a dielectric material such as PSG, BSG, BPSG, USG, or the like, and may be deposited by any suitable method, such as CVD, PECVD, or the like.

Further in FIGS. 22A and 22B, contacts 116 and contacts 118 are formed through the second ILD 114 and the first ILD 96. Openings for the contacts 118 are formed through the first ILD 96 and the second ILD 114 and openings for the contacts 116 are formed through the second ILD 114. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the contacts 116 and the contacts 118 in the openings. An anneal process may be performed to form a silicide at the interface between the epitaxial source/drain regions 92 and the contacts 118. The contacts 118 are physically and electrically coupled to the epitaxial source/drain regions 92 and may be referred to as source/drain contacts. The contacts 116 are physically and electrically coupled to the second electrode layer 112 and may be referred to as capacitor contacts. The contacts 116 and the contacts 118 may be formed in different processes, or may be formed in the same process. Although shown as being formed in the same cross-sections, it should be appreciated that each of the contacts 116 and the contacts 118 may be formed in different cross-sections, which may avoid shorting of the contacts.

As illustrated in FIGS. 22A and 22B, the memory film 110, formed over the first electrode layer 106, may separate the contacts 116 from the first electrode layer 106, even in cases in which the contacts 116 are misaligned (represented in FIGS. 22A and 22B by the dashed outlines of the contacts 116). For example, the memory film 110 covers and physically separates the first electrode layer 106 from the contacts 116. This prevents shunting from the contacts 116 through the first electrode layer 106, which prevents device errors and improves device performance.

Figure 23B:
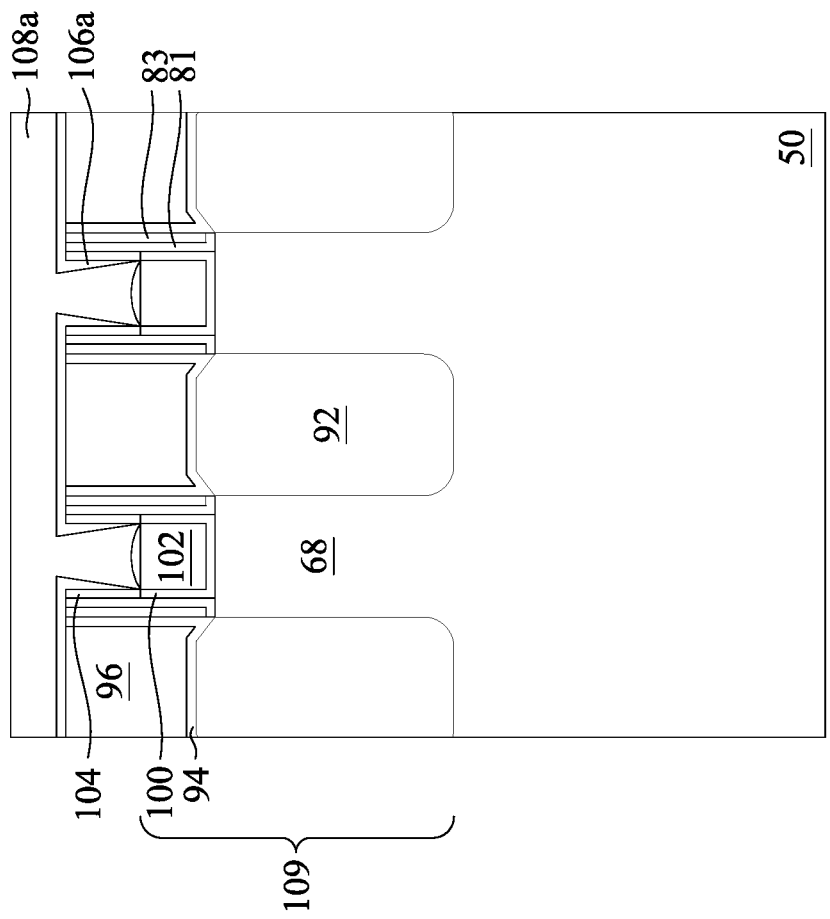
Figure 23A:
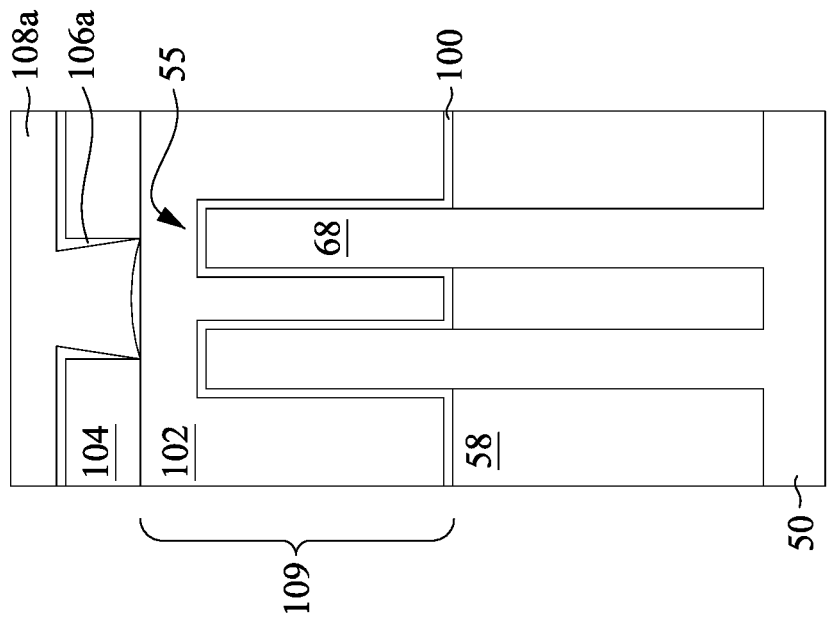

FIGS. 23A through 27B illustrate an embodiment in which a first electrode layer 106a is formed by PVD, rather than CVD or ALD, as in the embodiment illustrated in FIGS. 18A through 22B. The steps performed in and discussed with respect to FIGS. 2 through 17B may be performed prior to the steps illustrated in FIGS. 23A and 23B. In FIGS. 23A and 23B, the first electrode layer 106a and a first hard mask layer 108a are formed in the fourth recesses 105 (see FIGS. 17A and 17B) and extending over the first dielectric layer 104, the first ILD 96, the CESL 94, the first spacers 81, and the second spacers 83. The first electrode layer 106a may be deposited by a less conformal process than the process used in the embodiment of FIGS. 18A through 22B, such as PVD or the like. The first electrode layer 106a may be a conductive material, such as titanium nitride (TiN), ruthenium (Ru), tantalum (Ta), titanium (Ti), aluminum (Al), tungsten (W), combinations thereof, or the like. The first electrode layer 106a may have a thickness from about 1 nm to about 15 nm. The first hard mask layer 108a may be deposited by spin-on-coating or the like. The first hard mask layer 108a may include a polymer material, such as poly(methyl)acrylate, poly(maleimide), novolacs, poly(ether)s, combinations thereof, or the like. In some embodiments, the first hard mask layer 108a may be a bottom anti-reflective coating (BARC) material.

As illustrated in FIGS. 23A and 23B, the first electrode layer 106a may not be conformal. For example, a bottom portion of the first electrode layer 106a may have a curved surface, sidewall portions of the first electrode layer 106a may have inclined surfaces, and a thickness of the first electrode layer 106a may vary. However, in some embodiments, the bottom portion and the sidewall portions of the first electrode layer 106a may have curved or inclined surfaces. Depositing the first electrode layer 106a using PVD may cause inner sidewalls of the first electrode layer 106a to have thicknesses which taper in a direction towards the substrate 50 and a bottom portion of the first electrode layer 106a extending along the gate electrode 102 to have a greater thickness in the center, which decreases towards the edges of the first electrode layer 106a. In some embodiments, portions of the first electrode layer 106a disposed on sidewalls of the first dielectric layer 104 may be continuous with portions of the first electrode layer 106a disposed on top surfaces of the gate stack. In some embodiments, the portions of the first electrode layer 106a disposed on the sidewalls of the first dielectric layer 104 may be discontinuous with the portions of the first electrode layer 106a disposed on the top surfaces of the gate stack. Forming the first electrode layer 106a as a continuous or discontinuous layer may be used to tune the capacitance (e.g., the capacitor area) of a subsequently formed capacitor including the first electrode layer 106a. This provides greater flexibility for completed devices.

Figure 24B:
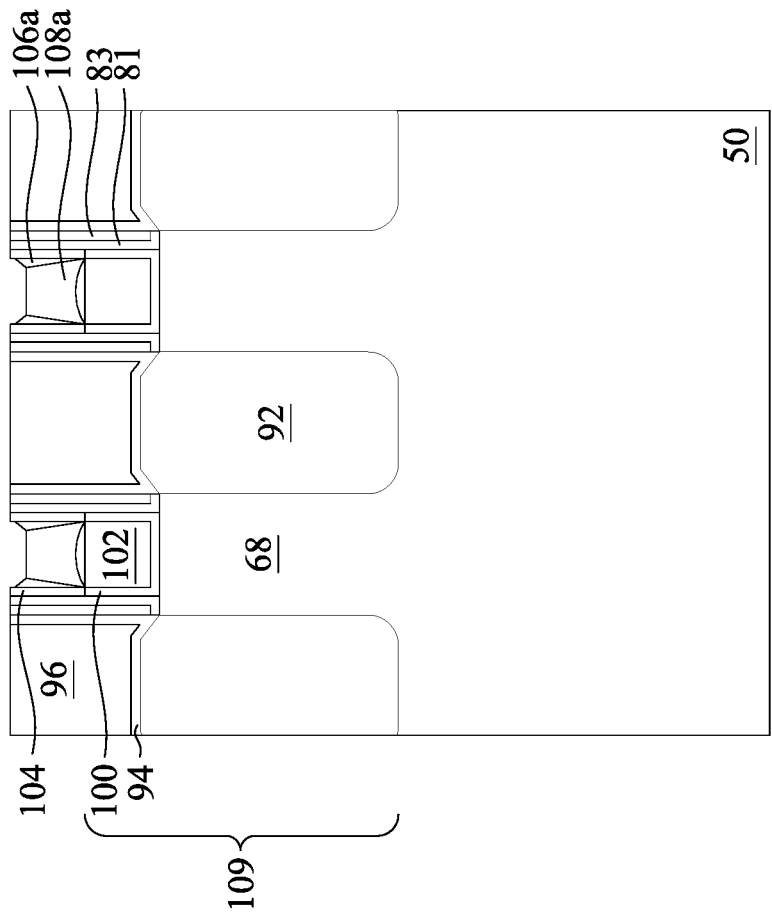
Figure 24A:
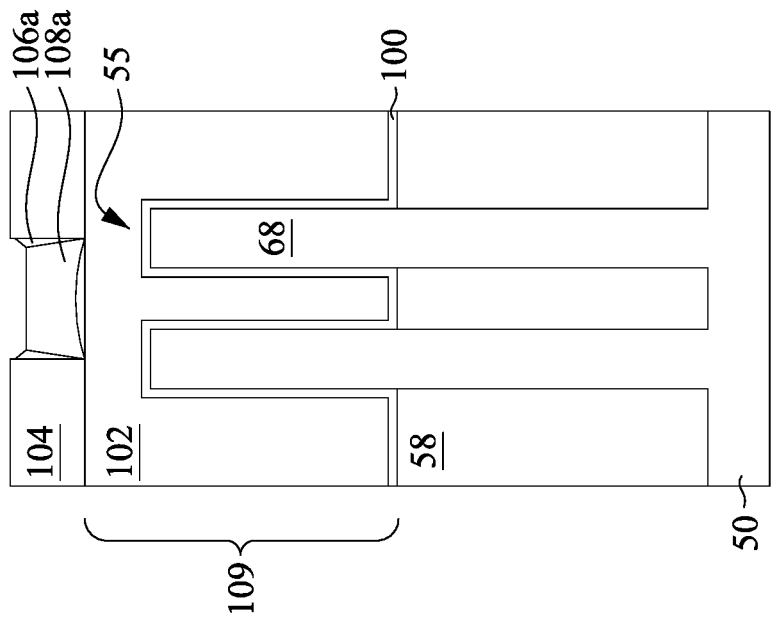

In FIGS. 24A and 24B, the first hard mask layer 108a and the first electrode layer 106a are etched. The first hard mask layer 108a and the first electrode layer 106a may be etched by one or more etching processes, such as isotropic etching processes (e.g., wet etching processes), anisotropic etching processes (e.g., dry etching processes), combinations thereof, or the like. In some embodiments, the first hard mask layer 108a may be etched by a first etching process to expose top portions and sidewall portions of the first electrode layer 106a. The first electrode layer 106a may then be etched by a second etching process using the first hard mask layer 108a as a mask. In some embodiments, the first etching process and the second etching process may be isotropic etching processes. In some embodiments, the first electrode layer 106a and the first hard mask layer 108a may be etched simultaneously.

As illustrated in FIGS. 24A and 24B, after the first hard mask layer 108a and the first electrode layer 106a are etched, top surfaces of the first hard mask layer 108a and the first electrode layer 106a are disposed below top surfaces of the first dielectric layer 104, the first ILD 96, the CESL 94, the first spacers 81, and the second spacers 83. Moreover, the top surfaces of the first electrode layer 106a may be disposed below the top surfaces of the first hard mask layer 108a. The top surfaces of the first electrode layer 106a may be straight and inclined, as illustrated in FIGS. 24A and 24B; however, in some embodiments, the top surfaces of the first electrode layer 106a may be horizontal, may be curved, or the like. Etching the first electrode layer 106a such that top surfaces of the first electrode layer 106a are below the top surfaces of the first ILD 96, the CESL 94, the first spacers 81, and the second spacers 83 helps to isolate the first electrode layer 106a from subsequently formed contacts (such as the contacts 116a, discussed below with respect to FIGS. 27A and 27B), which prevents shunting, reduces device errors, and improves device performance. Moreover, the first hard mask layer 108a protects sidewall portions and bottom portions of the first electrode layer 106a such that the first electrode layer 106a may be used as a bottom electrode in a subsequently completed FE capacitor.

Figure 25B:
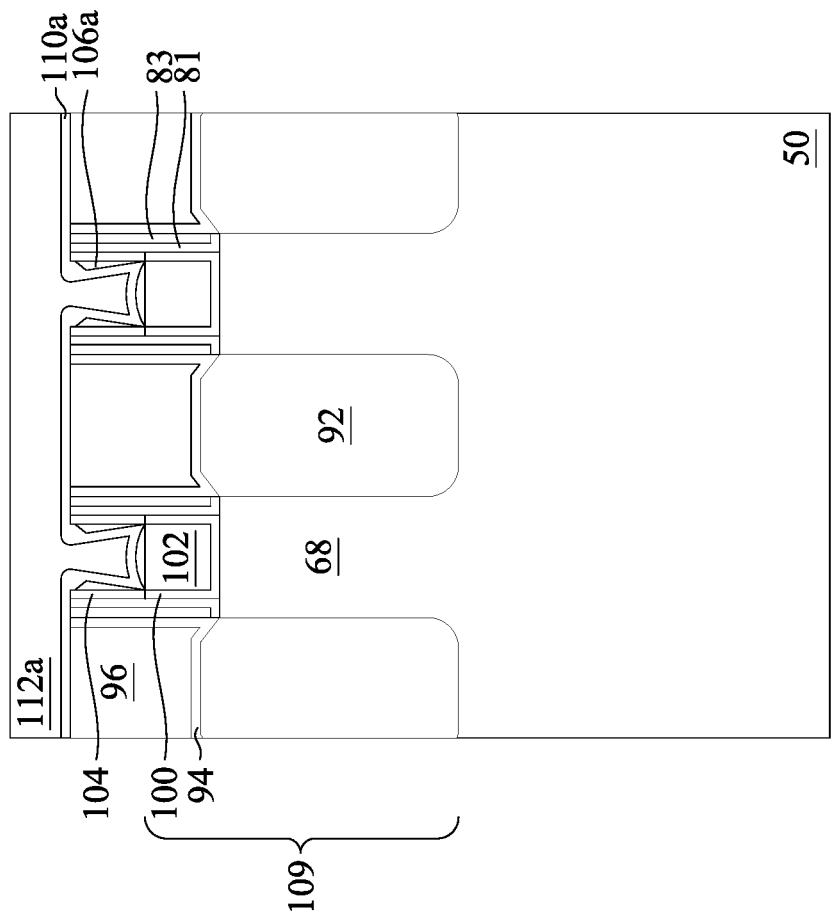
Figure 25A:
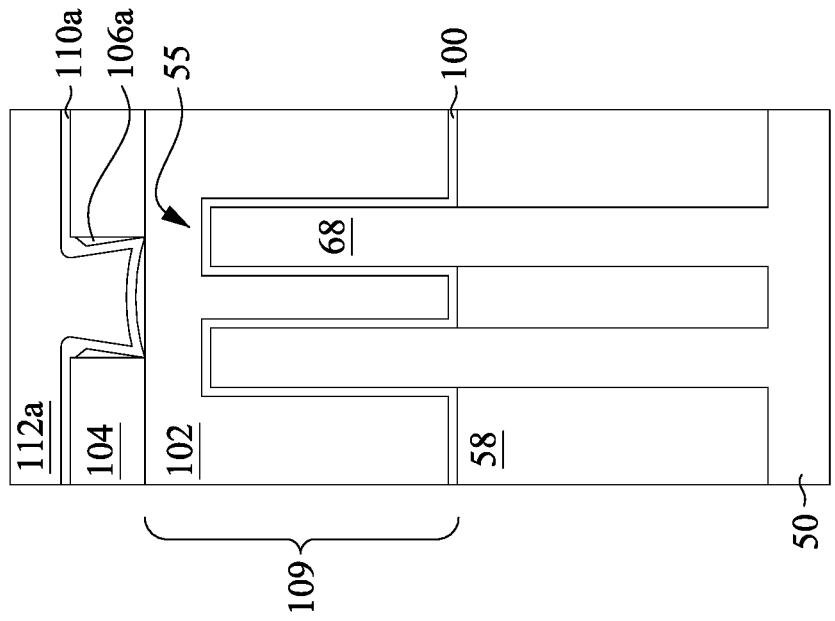

In FIGS. 25A and 25B, the first hard mask layer 108a is removed and a memory film 110a and a second electrode layer 112a are formed over the first electrode layer 106a, the first dielectric layer 104, the first ILD 96, the CESL 94, the first spacers 81, and the second spacers 83. The first hard mask layer 108a may be removed by plasma ashing, an etching process such as an isotropic or an anisotropic etching process, or the like.

The memory film 110a may be deposited by CVD, ALD, or the like. The memory film 110a may comprise a material that is capable of switching between two different polarization directions by applying an appropriate voltage differential across the memory film 110a. The memory film 110a may be a high-k dielectric material. In some embodiments, the memory film 110a comprises a ferroelectric (FE) material, such as a metal-oxide (e.g., hafnium oxide ($Hf_xO_y$) or the like), a component-metal-oxide (e.g., hafnium-silicon-oxide ($Hf_xSi_yO_z$), hafnium-aluminum-oxide ($Hf_xAl_yO_z$), hafnium-gadolinium-oxide ($Hf_xGd_yO_z$), hafnium-zirconium-oxide ($Hf_xZr_yO_z$), hafnium-lanthanum-oxide ($Hf_xLa_yO_z$), hafnium-strontium-oxide ($Hf_xSr_yO_z$), hafnium-yttrium-oxide ($Hf_xY_yO_z$), strontium titanate ($SrTiO_3$), or the like), a metal-oxynitride (e.g., hafnium oxynitride ($Hf_xO_yN_z$) or the like), multiple layers or combinations thereof, or the like. In some embodiments, the memory film 110a may comprise different ferroelectric materials or different types of memory materials. In some embodiments, the memory film 110a may be a multilayer memory structure comprising a layer of $SiN_x$ between two $SiO_x$ layers (e.g., an ONO structure). The memory film 110a may have a thickness from about 1 nm to about 20 nm.

The second electrode layer 112a may be deposited by CVD, ALD, or the like. The second electrode layer 112a may be a conductive material, such as titanium nitride (TiN), ruthenium (Ru), tantalum (Ta), titanium (Ti), aluminum (Al), tungsten (W), combinations thereof, or the like. The second electrode layer 112a may have a thickness from about 1 nm to about 15 nm.

As illustrated in FIGS. 25A and 25B, the memory film 110a may be deposited in contact with topmost surfaces and sidewalls of the first electrode layer 106a, top surfaces and sidewalls of the first dielectric layer 104, and top surfaces of the first ILD 96, the CESL 94, the first spacers 81, and the second spacers 83. Forming the memory film 110a along topmost surfaces of sidewall portions of the first electrode layer 106a separates and isolates the first electrode layer 106a from subsequently formed contacts (such as the contacts 116, discussed below with respect to FIGS. 27A and 27B) such that shunting is prevented, device errors are reduced, and device performance is improved. Further, in embodiments in which the first electrode layer 106a is discontinuous, the memory film 110a may be formed in contact with the first dielectric layer 104 between the discontinuous side portions and bottom portion of the first electrode layer 106a. Forming the memory film 110a between the discontinuous portions of the first electrode layer 106a may isolate the side portions of the first electrode layer 106a from the bottom portions of the first electrode layer 106a, which prevents shorting between the portions of the first electrode layer 106a.

Figures 26A, 26B:
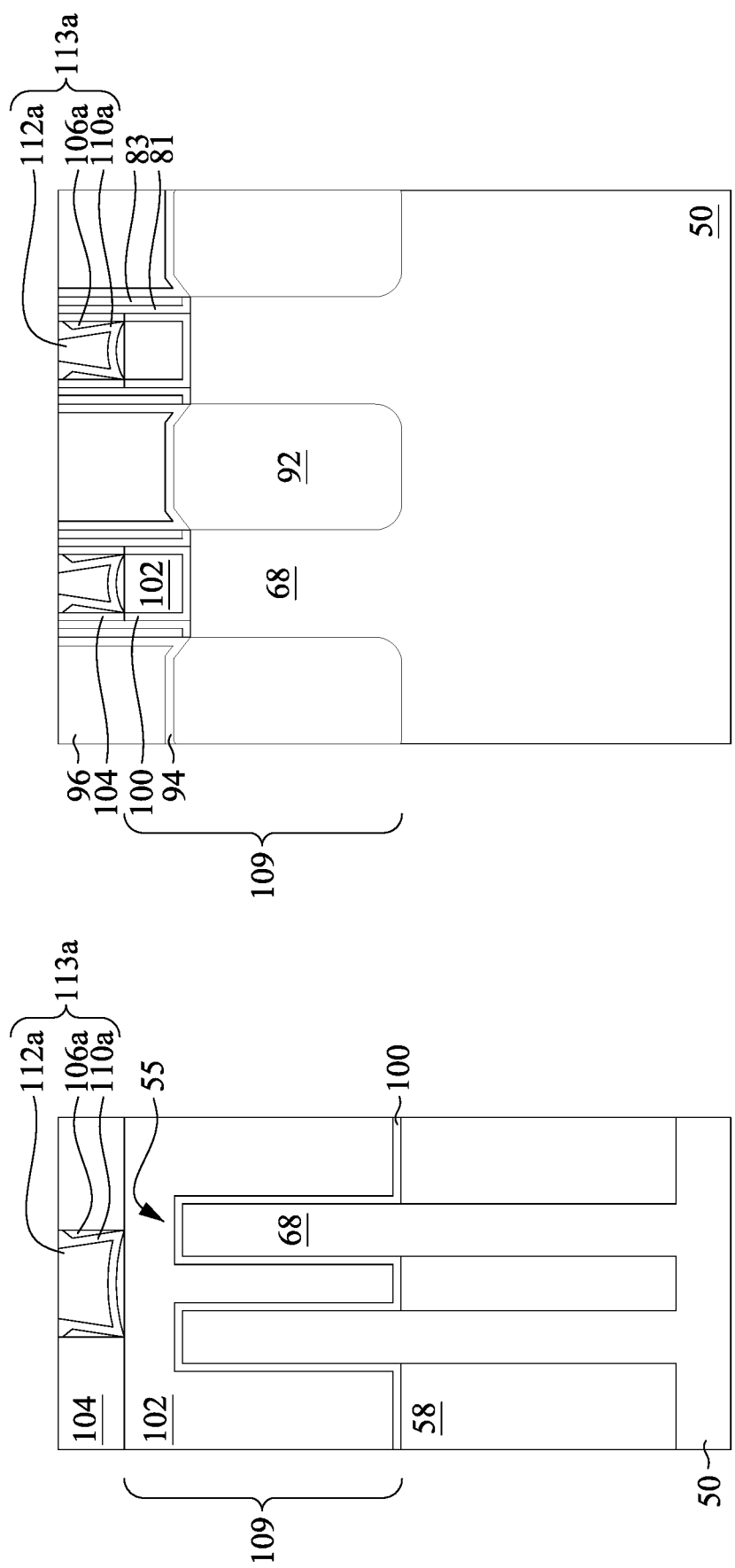

In FIGS. 26A and 26B, a planarization process, such as a CMP, is performed to level top surfaces of the memory film 110a and the second electrode layer 112a with top surfaces of the first dielectric layer 104, the first ILD 96, the CESL 94, the first spacers 81, and the second spacers 83. The planarization process may form capacitors 113a including the first electrode layer 106a, the memory film 110a, and the second electrode layer 112a. After the planarization process, top surfaces of the memory film 110a, the second electrode layer 112a, the first dielectric layer 104, the first ILD 96, the CESL 94, the first spacers 81, and the second spacers 83 are level. The combination of the first electrode layer 106a, the memory film 110a, and the second electrode layer 112a may function as the capacitors 113a (e.g., FE capacitors) in the completed device. Each of the capacitors 113a, including the first electrode layer 106a, the memory film 110a, and the second electrode layer 112a may be electrically coupled to the metal gate structure (e.g., the gate electrode 102) of an underlying FinFET to form a 1T-1C memory cell (e.g., a FERAM memory cell).

In FIGS. 27A and 27B, a second ILD 114 is deposited over the first ILD 96 and contacts 116 and contacts 118 are formed in the second ILD 114. In some embodiments, the second ILD 114 is a flowable film formed by FCVD. In some embodiments, the second ILD 114 is formed of a dielectric material such as PSG, BSG, BPSG, USG, or the like, and may be deposited by any suitable method, such as CVD, PECVD, or the like.

Further in FIGS. 27A and 27B, contacts 116 and contacts 118 are formed through the second ILD 114 and the first ILD 96. Openings for the contacts 118 are formed through the first ILD 96 and the second ILD 114 and openings for the contacts 116 are formed through the second ILD 114. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the contacts 116 and the contacts 118 in the openings. An anneal process may be performed to form a silicide at the interface between the epitaxial source/drain regions 92 and the contacts 118. The contacts 118 are physically and electrically coupled to the epitaxial source/drain regions 92 and may be referred to as source/drain contacts. The contacts 116 are physically and electrically coupled to the second electrode layer 112a and may be referred to as capacitor contacts. The contacts 116 and the contacts 118 may be formed in different processes, or may be formed in the same process. Although shown as being formed in the same cross-sections, it should be appreciated that each of the contacts 116 and the contacts 118 may be formed in different cross-sections, which may avoid shorting of the contacts.

As illustrated in FIGS. 27A and 27B, the memory film 110a, formed over the first electrode layer 106a, may separate the contacts 116 from the first electrode layer 106a. This prevents shunting from the contacts 116 through the first electrode layer 106a, which prevents device errors and improves device performance. Moreover, sidewall portions and bottom portions of the first electrode layer 106a may be continuous or discontinuous, which provides additional control over the capacitance and capacitor size of the capacitors including the first electrode layer 106a, the memory film 110a, and the second electrode layer 112a.

Figure 28B:
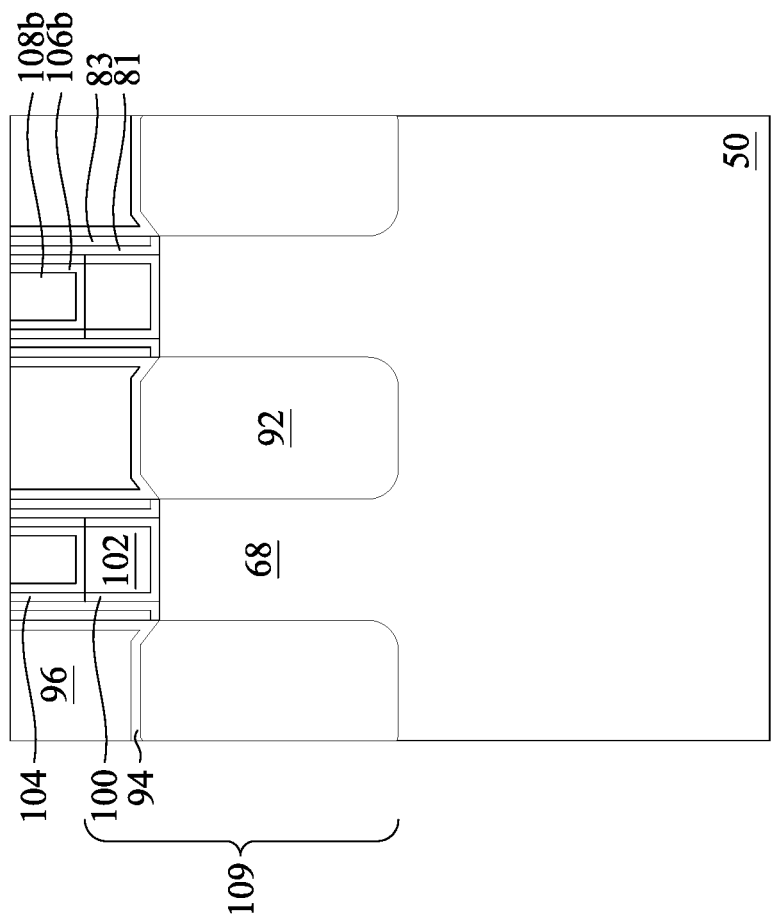
Figure 28A:
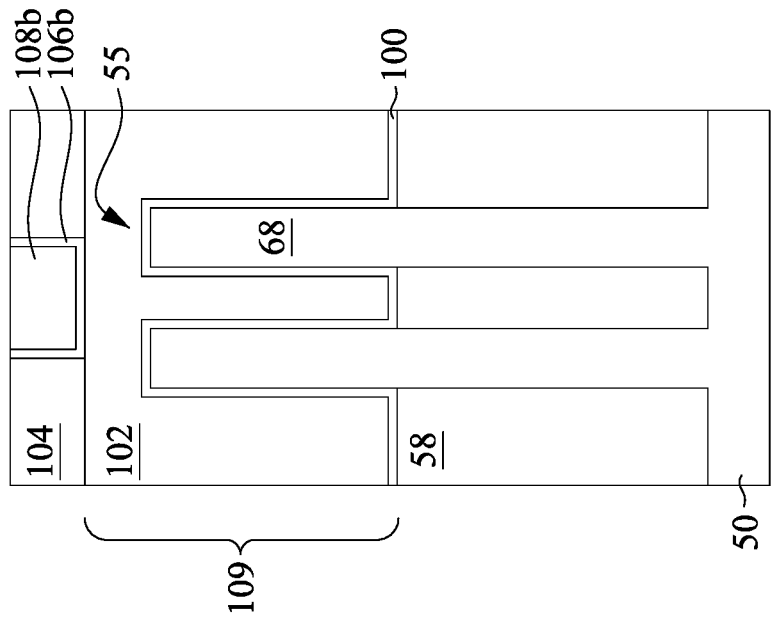

FIGS. 28A through 32B illustrate an embodiment in which a first electrode layer 106b and a first hard mask layer 108b are planarized before etching the first electrode layer 106b. The steps performed in and discussed with respect to FIGS. 2 through 18B may be performed prior to the steps illustrated in FIGS. 28A and 28B. In FIGS. 28A and 28B, a planarization process, such as a CMP, is performed to level top surfaces of the first electrode layer 106b and the first hard mask layer 108b with top surfaces of the first dielectric layer 104, the first ILD 96, the CESL 94, the first spacers 81, and the second spacers 83. After the planarization process, top surfaces of the first electrode layer 106b, the first hard mask layer 108b, the first dielectric layer 104, the first ILD 96, the CESL 94, the first spacers 81, and the second spacers 83 are level.

Figure 29B:
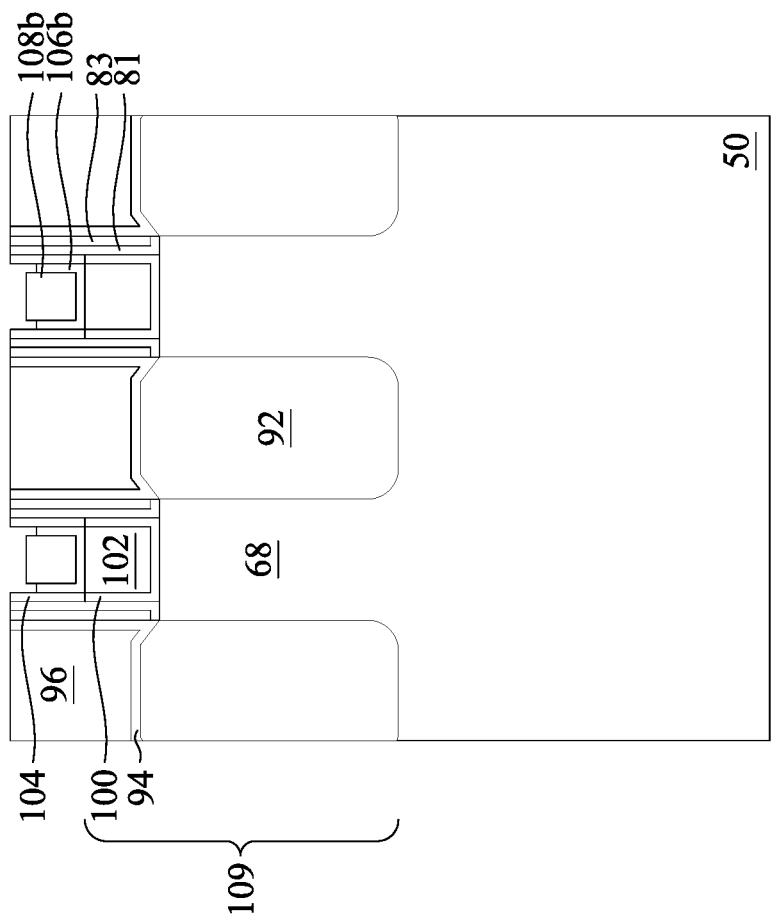
Figure 29A:
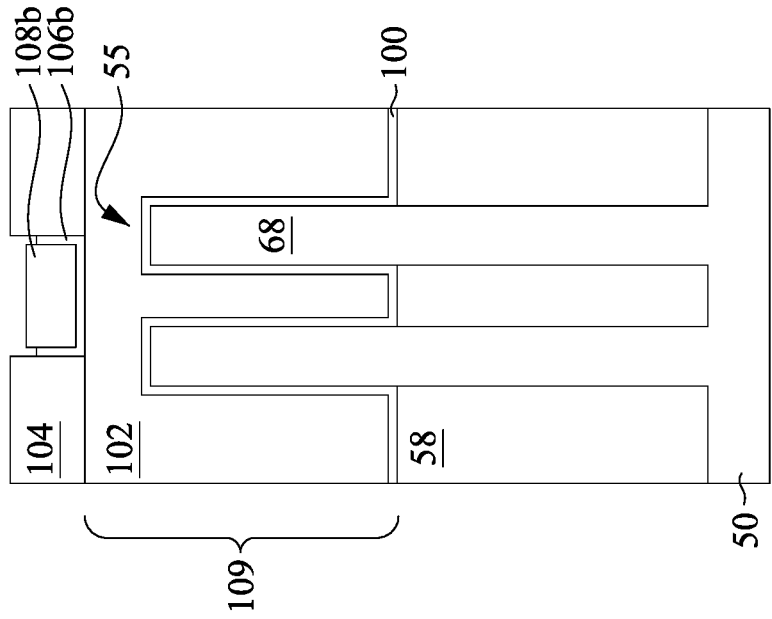

In FIGS. 29A and 29B, the first electrode layer 106b is etched. The first electrode layer 106b may be etched by one or more etching processes, such as an isotropic etching process (e.g., a wet etching process), an anisotropic etching process (e.g., a dry etching process), a combination thereof, or the like. The first electrode layer 106b may be etched using an acceptable etching process, such as one that is selective to the material of the first electrode layer 106b (e.g., etches the material of the first electrode layer 106b at a faster rate than material of the first dielectric layer 104, the first ILD 96, the CESL 94, the first spacers 81, the second spacers 83, and the first hard mask layer 108b). As illustrated in FIGS. 29A and 29B, some material of the first hard mask layer 108b may be removed by the etching of the first electrode layer 106b. In some embodiments, the first electrode layer may be etched using an isotropic etching process.

As illustrated in FIGS. 29A and 29B, after the first electrode layer 106b is etched, top surfaces of the first hard mask layer 108b and the first electrode layer 106b may be disposed below top surfaces of the first dielectric layer 104, the first ILD 96, the CESL 94, the first spacers 81, and the second spacers 83. In some embodiments, top surfaces of the first hard mask layer 108b may be level with top surfaces of the first dielectric layer 104, the first ILD 96, the CESL 94, the first spacers 81, and the second spacers 83. The top surfaces of the first electrode layer 106b may be disposed below the top surfaces of the first hard mask layer 108b. The top surfaces of the first electrode layer 106b may be straight and horizontal, as illustrated in FIGS. 29A and 29B; however, in some embodiments, the top surfaces of the first electrode layer 106a may be inclined, may be curved, or the like. Etching the first electrode layer 106b such that top surfaces of the first electrode layer 106b are below the top surfaces of the first ILD 96, the CESL 94, the first spacers 81, and the second spacers 83 helps to isolate the first electrode layer 106b from subsequently formed contacts (such as the contacts 116, discussed below with respect to FIGS. 32A and 32B), which prevents shunting, reduces device errors, and improves device performance. Moreover, the first hard mask layer 108b protects sidewall portions and bottom portions of the first electrode layer 106b such that the first electrode layer 106b may be used as a bottom electrode in a subsequently completed FE capacitor.

Figure 30B:
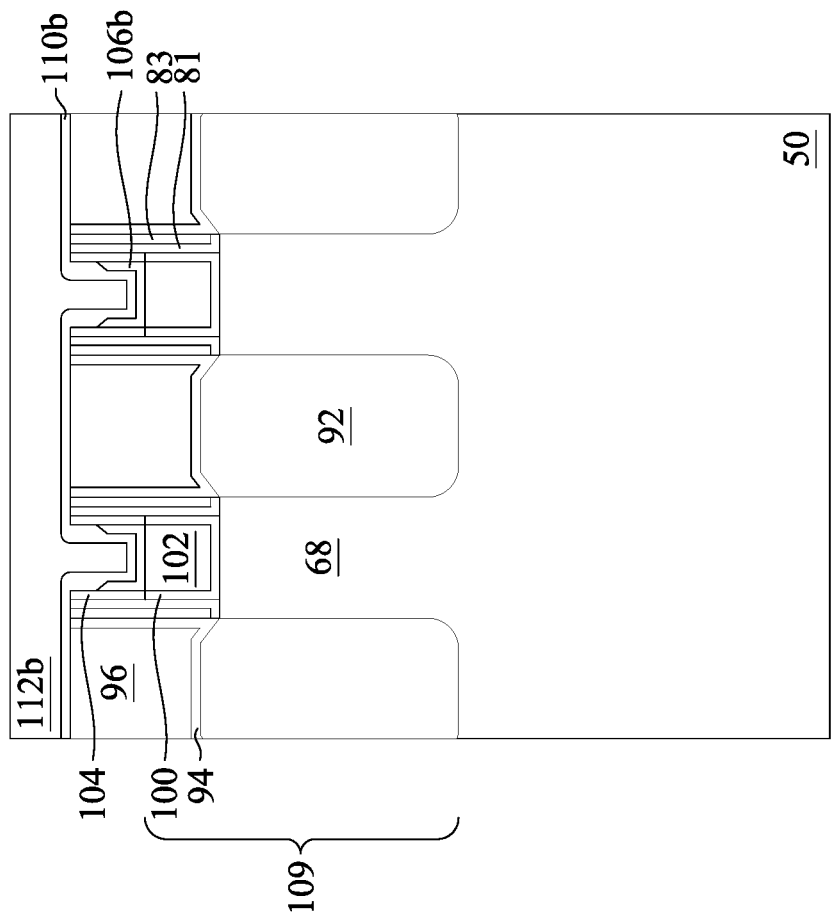
Figure 30A:
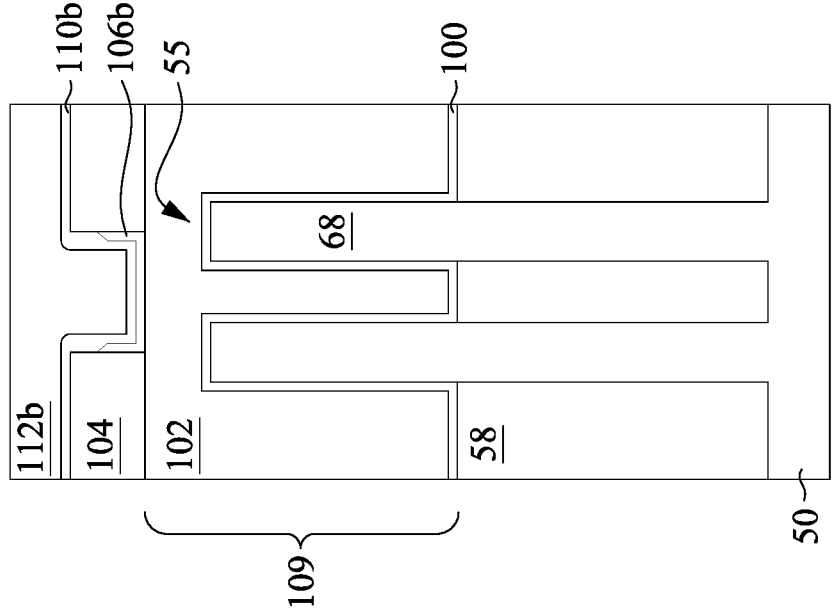

In FIGS. 30A and 30B, the first hard mask layer 108b is removed and a memory film 110b and a second electrode layer 112b are formed over the first electrode layer 106b, the first dielectric layer 104, the first ILD 96, the CESL 94, the first spacers 81, and the second spacers 83. The first hard mask layer 108b may be removed by plasma ashing, an etching process such as an isotropic or an anisotropic etching process, or the like. As illustrated in FIGS. 30A and 30B, the process used to remove the first hard mask layer 108b may etch the first electrode layer 106b, such that top surfaces of the first electrode layer 106b are straight and inclined. However, in some embodiments, the first hard mask layer 108b may be removed without etching the first electrode layer 106b such that the top surfaces of the first electrode layer 106b remain straight and horizontal.

The memory film 110b may be deposited by CVD, ALD, or the like. The memory film 110b may comprise a material that is capable of switching between two different polarization directions by applying an appropriate voltage differential across the memory film 110b. The memory film 110b may be a high-k dielectric material. In some embodiments, the memory film 110b comprises a ferroelectric (FE) material, such as a metal-oxide (e.g., hafnium oxide ($Hf_xO_y$) or the like), a component-metal-oxide (e.g., hafnium-silicon-oxide ($Hf_xSi_yO_z$), hafnium-aluminum-oxide ($Hf_xAl_yO_z$), hafnium-gadolinium-oxide ($Hf_xGd_yO_z$), hafnium-zirconium-oxide ($Hf_xZr_yO_z$), hafnium-lanthanum-oxide ($Hf_xLa_yO_z$), hafnium-strontium-oxide ($Hf_xSr_yO_z$), hafnium-yttrium-oxide ($Hf_xY_yO_z$), strontium titanate ($SrTiO_3$), or the like), a metal-oxynitride (e.g., hafnium oxynitride ($Hf_xO_yN_z$) or the like), multiple layers or combinations thereof, or the like. In some embodiments, the memory film 110b may comprise different ferroelectric materials or different types of memory materials. In some embodiments, the memory film 110b may be a multilayer memory structure comprising a layer of $SiN_x$ between two $SiO_x$ layers (e.g., an ONO structure). The memory film 110b may have a thickness from about 1 nm to about 20 nm.

The second electrode layer 112b may be deposited by CVD, ALD, or the like. The second electrode layer 112b may be a conductive material, such as titanium nitride (TiN), ruthenium (Ru), tantalum (Ta), titanium (Ti), aluminum (Al), tungsten (W), combinations thereof, or the like. The second electrode layer 112b may have a thickness from about 1 nm to about 15 nm.

As illustrated in FIGS. 30A and 30B, the memory film 110b may be deposited in contact with topmost surfaces and sidewalls of the first electrode layer 106b, top surfaces and sidewalls of the first dielectric layer 104, and top surfaces of the first ILD 96, the CESL 94, the first spacers 81, and the second spacers 83. Forming the memory film 110b along topmost surfaces of sidewall portions of the first electrode layer 106b separates and isolates the first electrode layer 106b from subsequently formed contacts (such as the contacts 116, discussed below with respect to FIGS. 32A and 32B) such that shunting is prevented, device errors are reduced, and device performance is improved.

Figure 31B:
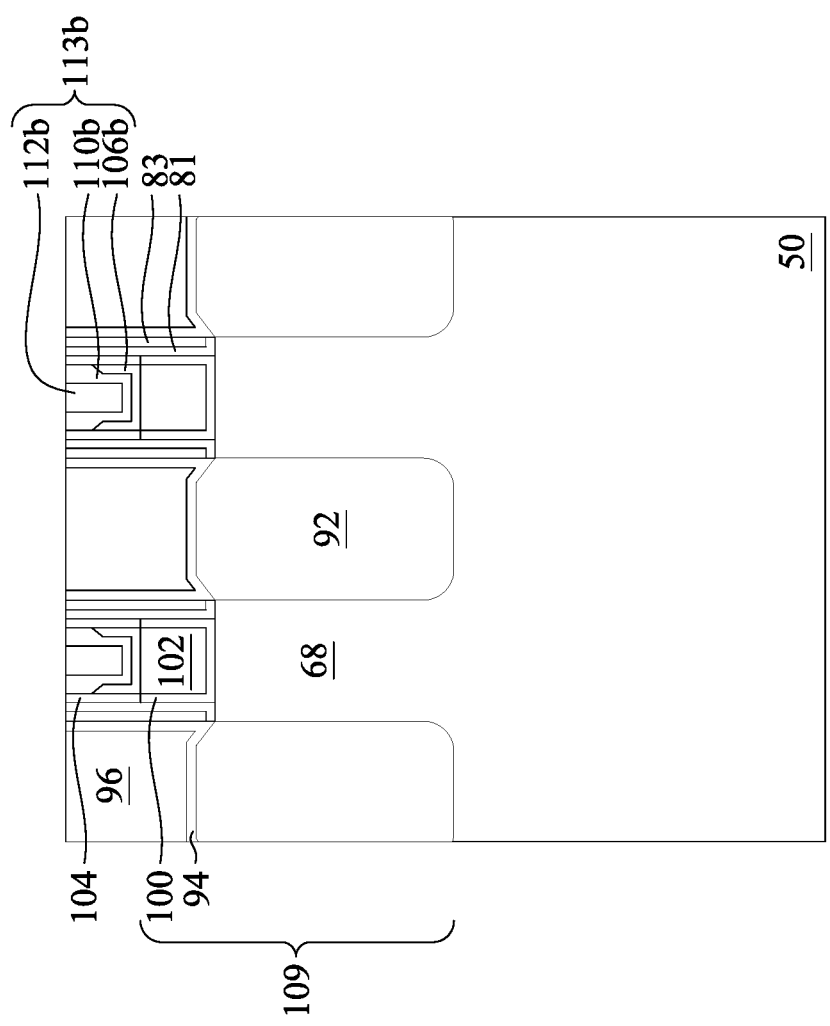
Figure 31A:
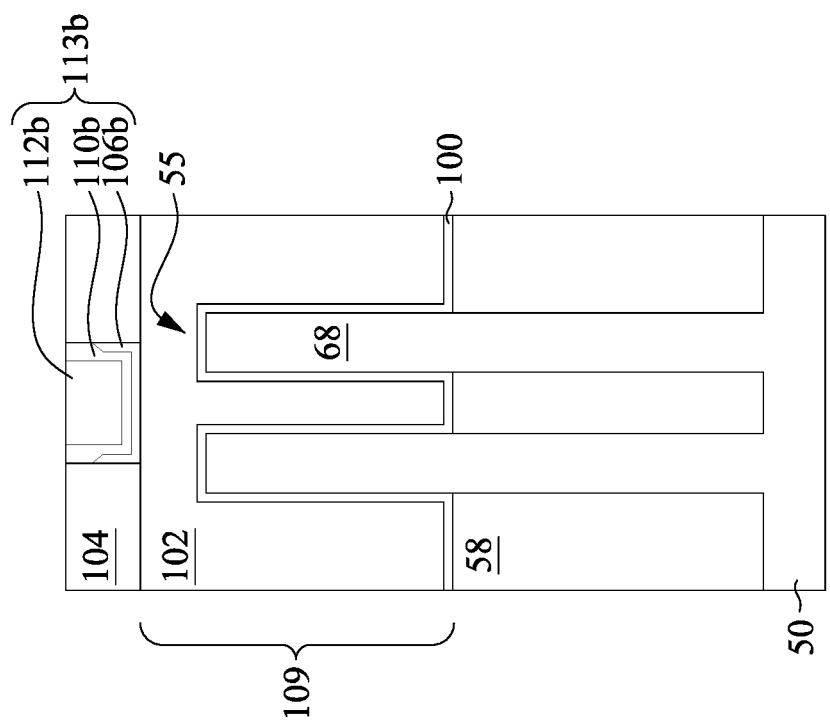

In FIGS. 31A and 31B, a planarization process, such as a CMP, is performed to level top surfaces of the memory film 110b and the second electrode layer 112b with top surfaces of the first dielectric layer 104, the first ILD 96, the CESL 94, the first spacers 81, and the second spacers 83. The planarization process may form capacitors 113b including the first electrode layer 106b, the memory film 110b, and the second electrode layer 112b. After the planarization process, top surfaces of the memory film 110b, the second electrode layer 112b, the first dielectric layer 104, the first ILD 96, the CESL 94, the first spacers 81, and the second spacers 83 are level. The combination of the first electrode layer 106b, the memory film 110b, and the second electrode layer 112b may function as the capacitors 113b (e.g., FE capacitors) in the completed device. Each of the capacitors 113b, including the first electrode layer 106b, the memory film 110b, and the second electrode layer 112b may be electrically coupled to the metal gate structure (e.g., the gate electrode 102) of an underlying FinFET to form a 1T-1C memory cell (e.g., a FERAM memory cell).

In FIGS. 32A and 32B, a second ILD 114 is deposited over the first ILD 96 and contacts 116 and contacts 118 are formed in the second ILD 114. In some embodiments, the second ILD 114 is a flowable film formed by FCVD. In some embodiments, the second ILD 114 is formed of a dielectric material such as PSG, BSG, BPSG, USG, or the like, and may be deposited by any suitable method, such as CVD, PECVD, or the like.

Further in FIGS. 32A and 32B, contacts 116 and contacts 118 are formed through the second ILD 114 and the first ILD 96. Openings for the contacts 118 are formed through the first ILD 96 and the second ILD 114 and openings for the contacts 116 are formed through the second ILD 114. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the contacts 116 and the contacts 118 in the openings. An anneal process may be performed to form a silicide at the interface between the epitaxial source/drain regions 92 and the contacts 118. The contacts 118 are physically and electrically coupled to the epitaxial source/drain regions 92 and may be referred to as source/drain contacts. The contacts 116 are physically and electrically coupled to the second electrode layer 112b and may be referred to as capacitor contacts. The contacts 116 and the contacts 118 may be formed in different processes, or may be formed in the same process. Although shown as being formed in the same cross-sections, it should be appreciated that each of the contacts 116 and the contacts 118 may be formed in different cross-sections, which may avoid shorting of the contacts. As illustrated in FIGS. 32A and 32B, the memory film 110b, formed over the first electrode layer 106b, may separate the contacts 116 from the first electrode layer 106b. This prevents shunting from the contacts 116 through the first electrode layer 106b, which prevents device errors and improves device performance.

Embodiments may achieve various advantages. For example, forming a first electrode layer in a first dielectric layer over a gate stack and etching back the first electrode layer such that top surfaces of the first electrode layer are below top surfaces of the first dielectric layer, and forming a memory film over top surfaces of the first electrode layer isolates the first electrode layer from subsequently formed contacts. This prevents shunting between the contacts and the first electrode layer, reduces error, and improves device performance.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a semiconductor device includes a gate stack over a semiconductor substrate; a capacitor over the gate stack, the capacitor including a first electrode extending along a top surface of the gate stack, the first electrode being U-shaped; a first ferroelectric layer over the first electrode; and a second electrode over the first ferroelectric layer, a top surface of the second electrode being level with a top surface of the first ferroelectric layer, and the top surface of the first ferroelectric layer and the top surface of the second electrode being disposed further from the semiconductor substrate than a topmost surface of the first electrode. In an embodiment, the semiconductor device further includes a first dielectric layer extending along the top surface of the gate stack, a top surface of the first dielectric layer being level with the top surface of the first ferroelectric layer and the top surface of the second electrode. In an embodiment, a combined width of the first dielectric layer and the first electrode is equal to a width of the gate stack. In an embodiment, the semiconductor device further includes a gate contact electrically coupled to the second electrode, the first ferroelectric layer separating the gate contact from the first electrode. In an embodiment, the first ferroelectric layer completely covers top surfaces of the first electrode. In an embodiment, the first ferroelectric layer is U-shaped, and a bottom surface of the first ferroelectric layer is disposed below the top surface of the first electrode. In an embodiment, a thickness of a sidewall of the first electrode layer tapers in a direction towards the semiconductor substrate.

In accordance with another embodiment, a semiconductor device includes a transistor structure over a semiconductor substrate; a first spacer extending along a sidewall of a gate structure of the transistor structure; a first dielectric layer over the gate structure, the first dielectric layer extending along a sidewall of the first spacer; and a capacitor over the gate structure, the capacitor extending through the first dielectric layer, the capacitor including a first electrode over the gate structure; a memory film over the first electrode, the memory film extending along a topmost surface of the first electrode, the topmost surface of the first electrode being above a bottommost surface of the memory film; and a second electrode over the memory film. In an embodiment, the first electrode includes a first portion extending along the gate structure and a second portion extending along a side surface of the first dielectric layer, the first portion and the second portion being discontinuous. In an embodiment, a thickness of the second portion tapers in a direction towards the semiconductor substrate, and the memory film isolates the first portion from the second portion. In an embodiment, the first electrode includes a first portion extending along the gate structure and a second portion extending along a side surface of the first dielectric layer, the second portion including the topmost surface, the first portion and the second portion being continuous. In an embodiment, the memory film includes a ferroelectric material. In an embodiment, a topmost surface of the memory film is level with a topmost surface of the second electrode, and the topmost surface of the memory film and the topmost surface of the second electrode are level with a topmost surface of the first spacer and a topmost surface of the first dielectric layer. In an embodiment, the semiconductor device further includes a gate contact electrically coupled to the second electrode, the memory film separating the gate contact from the first electrode.

In accordance with yet another embodiment, a method includes forming a gate stack over a substrate, the gate stack being adjacent a gate spacer; etching the gate stack to form a first recess; depositing a first electrode layer in the first recess; etching the first electrode layer such that top surfaces of the first electrode layer are below a top surface of the gate spacer; depositing a memory film over the first electrode layer; depositing a second electrode layer over the memory film; and planarizing the memory film and the second electrode layer such that a top surface of the memory film, a top surface of the second electrode layer, and a top surface of the gate spacer are level with one another. In an embodiment, the method further includes forming a hard mask layer over the first electrode layer, the hard mask layer masking portions of the first electrode layer while etching the first electrode layer. In an embodiment, the method further includes planarizing the hard mask layer and the first electrode layer before etching the first electrode layer. In an embodiment, the first electrode layer is deposited as a conformal layer by atomic layer deposition (ALD). In an embodiment, the method further includes depositing a first dielectric layer in the first recess; and etching the first dielectric layer to expose the gate stack, the first electrode layer being deposited after etching the first dielectric layer.

In an embodiment, the first electrode layer is deposited by physical vapor deposition (PVD), and the first electrode layer is deposited with a first portion extending along the gate stack and a second portion extending along the first dielectric layer, the first portion being discontinuous with the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack on a semiconductor substrate;
    forming a dielectric layer on the gate stack;
    etching the dielectric layer to form a first recess;
    forming a capacitor on the gate stack in the first recess, wherein forming the capacitor comprises:
        depositing a first electrode layer extending along a top surface of the gate stack, and side surfaces of the dielectric layer;
        etching back the first electrode layer;
        depositing a first ferroelectric layer on the first electrode layer;
        depositing a second electrode layer on the first ferroelectric layer; and
        planarizing the second electrode layer and the first ferroelectric layer.

2. The method of claim 1, wherein the first electrode layer is etched back such that a top surface of the first electrode layer is below a top surface of the dielectric layer.

3. The method of claim 1, wherein planarizing the second electrode layer and the first ferroelectric layer planarizes the dielectric layer.

4. The method of claim 1, further comprising forming gate spacers along opposite side surfaces of the gate stack, wherein the dielectric layer extends between opposite side surfaces of the gate spacers.

5. The method of claim 1, further comprising forming a gate contact electrically coupled to the second electrode layer, wherein the first ferroelectric layer separates the gate contact from the first electrode layer.

6. The method of claim 1, wherein a thickness of a sidewall of the first electrode layer tapers in a direction towards the semiconductor substrate after etching back the first electrode layer.

7. The method of claim 1, wherein the first ferroelectric layer is deposited below a top surface of the first electrode layer, wherein the first ferroelectric layer is U-shaped, and wherein the first electrode layer is U-shaped.

8. A method comprising:
    providing a transistor structure on a semiconductor substrate, the transistor structure comprising a gate structure;
    forming a first gate spacer extending along a side surface of the gate structure;
    etching back the gate structure to form a first recess;
    forming a first dielectric layer in the first recess; and
    forming a capacitor on the gate structure, the capacitor extending through the first dielectric layer, wherein forming the capacitor comprises:
        depositing a first electrode layer on the gate structure;
        depositing a memory film on the first electrode layer, the memory film extending along a topmost surface of the first electrode layer and below the topmost surface of the first electrode layer; and
        depositing a second electrode layer on the memory film.

9. The method of claim 8, further comprising etching the first electrode layer to form a first portion extending along the gate structure and a second portion extending along a side surface of the first dielectric layer and discontinuous from the first portion.

10. The method of claim 9, wherein the first electrode layer is etched such that a thickness of the second portion tapers in a direction towards the semiconductor substrate, and wherein the memory film is deposited between and isolating the first portion from the second portion.

11. The method of claim 8, further comprising etching the first electrode layer such that the topmost surface of the first electrode layer is below topmost surfaces of the first dielectric layer and the first gate spacer.

12. The method of claim 8, wherein the memory film comprises a ferroelectric material.

13. The method of claim 8, further comprising planarizing the memory film, the second electrode layer, the first gate spacer, and the first dielectric layer.

14. The method of claim 8, further comprising forming a gate contact electrically coupled to the second electrode layer, wherein the memory film separates the gate contact from the first electrode layer.

15. A method comprising:
    forming a gate stack over a substrate, wherein the gate stack is adjacent a gate spacer;
    etching the gate stack to form a first recess;
    depositing a first electrode layer in the first recess;
    etching the first electrode layer such that top surfaces of the first electrode layer are below a top surface of the gate spacer;
    depositing a memory film over the first electrode layer;
    depositing a second electrode layer over the memory film; and
    planarizing the memory film and the second electrode layer such that a top surface of the memory film, a top surface of the second electrode layer, and a top surface of the gate spacer are level with one another.

16. The method of claim 15, further comprising forming a hard mask layer over the first electrode layer, wherein the hard mask layer masks portions of the first electrode layer while etching the first electrode layer.

17. The method of claim 16, further comprising planarizing the hard mask layer and the first electrode layer before etching the first electrode layer.

18. The method of claim 15, wherein the first electrode layer is deposited as a conformal layer by atomic layer deposition (ALD).

19. The method of claim 15, further comprising:
    depositing a first dielectric layer in the first recess; and
    etching the first dielectric layer to expose the gate stack, wherein the first electrode layer is deposited after etching the first dielectric layer.

20. The method of claim 19, wherein the first electrode layer is deposited by physical vapor deposition (PVD), and wherein the first electrode layer is deposited with a first portion extending along the gate stack and a second portion extending along the first dielectric layer, the first portion being discontinuous with the second portion.

* * * * *